US011266016B2

(12) United States Patent
Kamitsubo et al.

(10) Patent No.: US 11,266,016 B2
(45) Date of Patent: Mar. 1, 2022

(54) RESIN MULTILAYER SUBSTRATE AND ELECTRONIC APPARATUS

(71) Applicant: Murata Manufacturing Co., Ltd., Nagaokakyo (JP)

(72) Inventors: Yusuke Kamitsubo, Nagaokakyo (JP); Ryosuke Takada, Nagaokakyo (JP); Tsuyoshi Katsube, Nagaokakyo (JP); Yasuhiro Kuratani, Nagaokakyo (JP); Shigeru Tago, Nagaokakyo (JP); Tomohiro Furumura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/319,396

(22) Filed: May 13, 2021

(65) Prior Publication Data
US 2021/0267051 A1    Aug. 26, 2021

Related U.S. Application Data

(63) Continuation of application No. PCT/JP2019/048709, filed on Dec. 12, 2019.

(30) Foreign Application Priority Data

Dec. 13, 2018   (JP) .............................. JP2018-233366
Nov. 15, 2019   (JP) .............................. JP2019-207082

(51) Int. Cl.
*H05K 1/11*        (2006.01)
*H05K 3/46*        (2006.01)
(Continued)

(52) U.S. Cl.
CPC ............. *H05K 1/036* (2013.01); *H05K 1/113* (2013.01); *H05K 1/148* (2013.01); *H05K 3/0094* (2013.01); *H05K 3/429* (2013.01); *H05K 3/4655* (2013.01); *H05K 3/4688* (2013.01); *H01R 12/62* (2013.01); *H05K 2201/015* (2013.01); *H05K 2201/0129* (2013.01); *H05K 2201/0141* (2013.01);
(Continued)

(58) Field of Classification Search
CPC ........ H05K 1/036; H05K 1/113; H05K 1/148; H05K 3/0094; H05K 3/429; H05K 3/4655; H05K 3/4688
See application file for complete search history.

(56) References Cited

FOREIGN PATENT DOCUMENTS

JP        11-54934 A     2/1999
JP        2004-047586 A  2/2004
(Continued)

OTHER PUBLICATIONS

Official Communication issued in International Patent Application No. PCT/JP2019/048709, dated Feb. 10, 2020.

*Primary Examiner* — Jeremy C Norris
(74) *Attorney, Agent, or Firm* — Keating & Bennett, LLP

(57) ABSTRACT

A resin multilayer substrate includes a multilayer body including resin layers and adhesive layers that are laminated, via conductors in the resin layers, and bonding portions in the adhesive layers. The bonding portion is connected to the via conductor. One of the resin layer and the adhesive layer is a gas high-permeable layer having a higher gas permeability than the other one. The bonding portion includes an organic substance, or has a higher void content rate per unit plane sectional area than the via conductor. At least a portion of each of the bonding portions contacts the gas high-permeable layers.

20 Claims, 12 Drawing Sheets

(51) Int. Cl.
*H05K 1/03* (2006.01)
*H05K 1/14* (2006.01)
*H05K 3/00* (2006.01)
*H05K 3/42* (2006.01)
*H01R 12/62* (2011.01)

(52) U.S. Cl.
CPC ............... *H05K 2201/096* (2013.01); *H05K 2201/09509* (2013.01)

(56) References Cited

FOREIGN PATENT DOCUMENTS

| | | |
|---|---|---|
| JP | 2004-303895 A | 10/2004 |
| JP | 2005-116660 A | 4/2005 |
| JP | 2015-149337 A | 8/2015 |
| WO | 2011/040502 A1 | 4/2011 | ns
RESIN MULTILAYER SUBSTRATE AND ELECTRONIC APPARATUS

CROSS REFERENCE TO RELATED APPLICATIONS

This application claims the benefit of priority to Japanese Patent Application No. 2019-207082 filed on Nov. 15, 2019 and Japanese Patent Application No. 2018-233366 filed on Dec. 13, 2018, and is a Continuation Application of PCT Application No. PCT/JP2019/048709 filed on Dec. 12, 2019. The entire contents of each application are hereby incorporated herein by reference.

BACKGROUND OF THE INVENTION

1. Field of the Invention

The present invention relates to a resin multilayer substrate including different kinds of resin layers that are laminated, and an electronic apparatus including the resin multilayer substrate.

2. Description of the Related Art

There has been known a resin multilayer substrate including a multilayer body provided by laminating a plurality of kinds of resin layers including different materials, and a via conductor provided in the multilayer body.

For example, Japanese Unexamined Patent Application Publication No. 11-54934 discloses a resin multilayer substrate including a multilayer body with an adhesive layer interposed between a plurality of resin layers, a via conductor (plated via) provided in the resin layer, and a bonding portion (for example, a conductive bonding structure including a low melting point metal material and a resin material) to be bonded to the via conductor. Accordingly, since the via conductor which is a plated via is used, the conductor loss of the circuit can be reduced compared to a case where the circuit is provided on the resin multilayer substrate using only the bonding portion (without using the via conductor). Further, according to the features described above, the via conductor can be connected to another conductor (for example, a planar conductor or another via conductor) by using the bonding portion which is a low melting point metal material, and therefore a more complicated circuit can be provided on the resin multilayer substrate.

Since the resin layer and the bonding portion include resin, when the resin layer and the bonding portion receive heat of equal to or higher than a predetermined temperature, a portion thereof is thermally decomposed to generate a gas, such as $CO_2$ and moisture. In a case where such gas and moisture remain in the multilayer body, when the resin multilayer substrate is heated (for example, during the formation of the multilayer body, during a reflow process at the time of mounting, during the mounting by a hot bar or the like, or during a bending process involving heating), gases (the above-described gas and a gas generated from the moisture) are likely to expand to cause interlayer peeling (delamination), a connection failure between the bonding portion and another conductor due to the interlayer peeling, and the like. Accordingly, it is important to discharge the gases to the outside of the multilayer body during the manufacture of the resin multilayer substrate, or the like.

However, when gas permeability of any one of the resin layer and the adhesive layer is low, it is difficult to efficiently discharge a gas generated during the heating of the resin multilayer substrate to the outside. In particular, since the amount of gas generated during the above-described heating in the bonding portion including the resin material is larger than that in the via conductor which is a plated via, interlayer peeling is likely to occur when the gas permeability of the adhesive layer in which the bonding portion is provided is low.

SUMMARY OF THE INVENTION

Preferred embodiments of the present invention provide resin multilayer substrates that each include a multilayer body, and a via conductor and a bonding portion provided in the multilayer body, and that each reduce or prevent the generation of interlayer peeling and the like by facilitating the discharge of a gas generated in the multilayer body when heated or a gas remaining in the multilayer body to the outside, and electronic apparatuses each including such a resin multilayer substrate.

A resin multilayer substrate according to a preferred embodiment of the present invention includes a multilayer body including a resin layer and an adhesive layer that are laminated, a via conductor in the resin layer, and a bonding portion in the adhesive layer and connected to the via conductor. A first one of the resin layer and the adhesive layer is a gas high-permeable layer having gas permeability higher than gas permeability of a second one of the resin layer and the adhesive layer, and the second one of the resin layer and the adhesive layer is a gas low-permeable layer having the gas permeability lower than the gas permeability of the first one of the resin layer and the adhesive layer. The bonding portion includes an organic substance or a portion having a void content rate per unit plane sectional area higher than a void content rate per unit plane sectional area of the via conductor, and at least a portion of the bonding portion contacts the gas high-permeable layer.

Accordingly, since the first one of the resin layer and the adhesive layer is a gas high-permeable layer having a higher gas permeability than the second one, a gas generated in the multilayer body when heated or a gas remaining in the multilayer body is easily discharged to the outside as compared with a multilayer body provided by laminating only the second one (gas low-permeable layer) with lower gas permeability of the resin layer and the adhesive layer.

Further, since the bonding portion in which a larger amount of gas is generated when heated than that in the via conductor is in contact with the gas high-permeable layer, the gas generated in the multilayer body when heated or the gas remaining in the multilayer body may be efficiently discharged to the outside. Accordingly, the interlayer peeling of the resin multilayer substrate when heated is reduced or prevented.

An electronic apparatus according to a preferred embodiment of the present invention includes a resin multilayer substrate and another structure. The resin multilayer substrate includes a multilayer body including a resin layer and an adhesive layer that are laminated, a via conductor in the resin layer, and a bonding portion in the adhesive layer and connected to the via conductor. A first one of the resin layer and the adhesive layer is a gas high-permeable layer having gas permeability higher than gas permeability of a second one of the resin layer and the adhesive layer, and the second one of the resin layer and the adhesive layer is a gas low-permeable layer having the gas permeability lower than the gas permeability of the first one of the resin layer and the adhesive layer. The bonding portion includes an organic substance or a portion having a void content rate per unit plane sectional area higher than a void content rate per unit plane sectional area of the via conductor, and at least a portion of the bonding portion contacts the gas high-permeable layer. The resin multilayer substrate is connected to the another structure via a conductive bonding structure.

Accordingly, an electronic apparatus including a resin multilayer substrate is able to be provided in which interlayer peeling generated when heated is reduced or prevented. Further, since the flatness of the surface of the multilayer body is secured even when heated, a mounting failure of the resin multilayer substrate with respect to another structure, a mounting failure of another structure with respect to the resin multilayer substrate, and the like are reduced or prevented.

According to preferred embodiments of the present invention, by including a multilayer body, and a via conductor and a bonding portion in the multilayer body, and by facilitating the discharge of a gas generated in the multilayer body when heated or a gas remaining in the multilayer body to the outside, resin multilayer substrates are each able to be provided that reduce or prevent the generation of interlayer peeling and the like, and an electronic apparatus including the above resin multilayer substrate is able to be provided.

The above and other elements, features, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1:
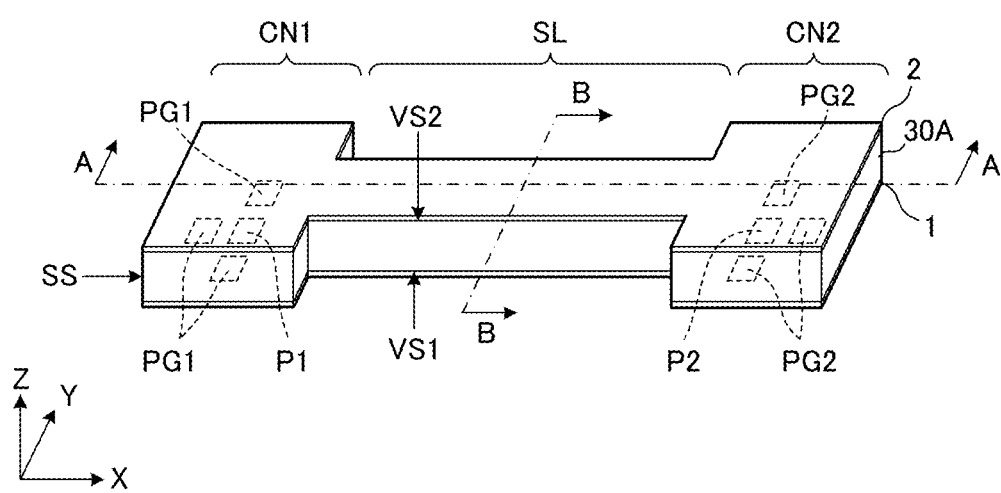
FIG. 1 is an external perspective view of a resin multilayer substrate 101 according to a first preferred embodiment of the present invention.

Hereinafter, preferred embodiments of the present invention will be described while referring to some specific examples with reference to the drawings. In the drawings, the same reference signs are provided to the same or similar elements. In consideration of describing the gist or facilitating the understanding, preferred embodiments will be described separately for convenience, but partial substitutions or combinations of the features and structures described in the different preferred embodiments are able to be implemented. In a second preferred embodiment and preferred embodiments after the second preferred embodiment, descriptions of elements common to the first preferred embodiment will be omitted, and only different points therefrom will be described. In particular, similar effects by similar features and elements will not be described in detail for each preferred embodiment.

First Preferred Embodiment

Figure 2:
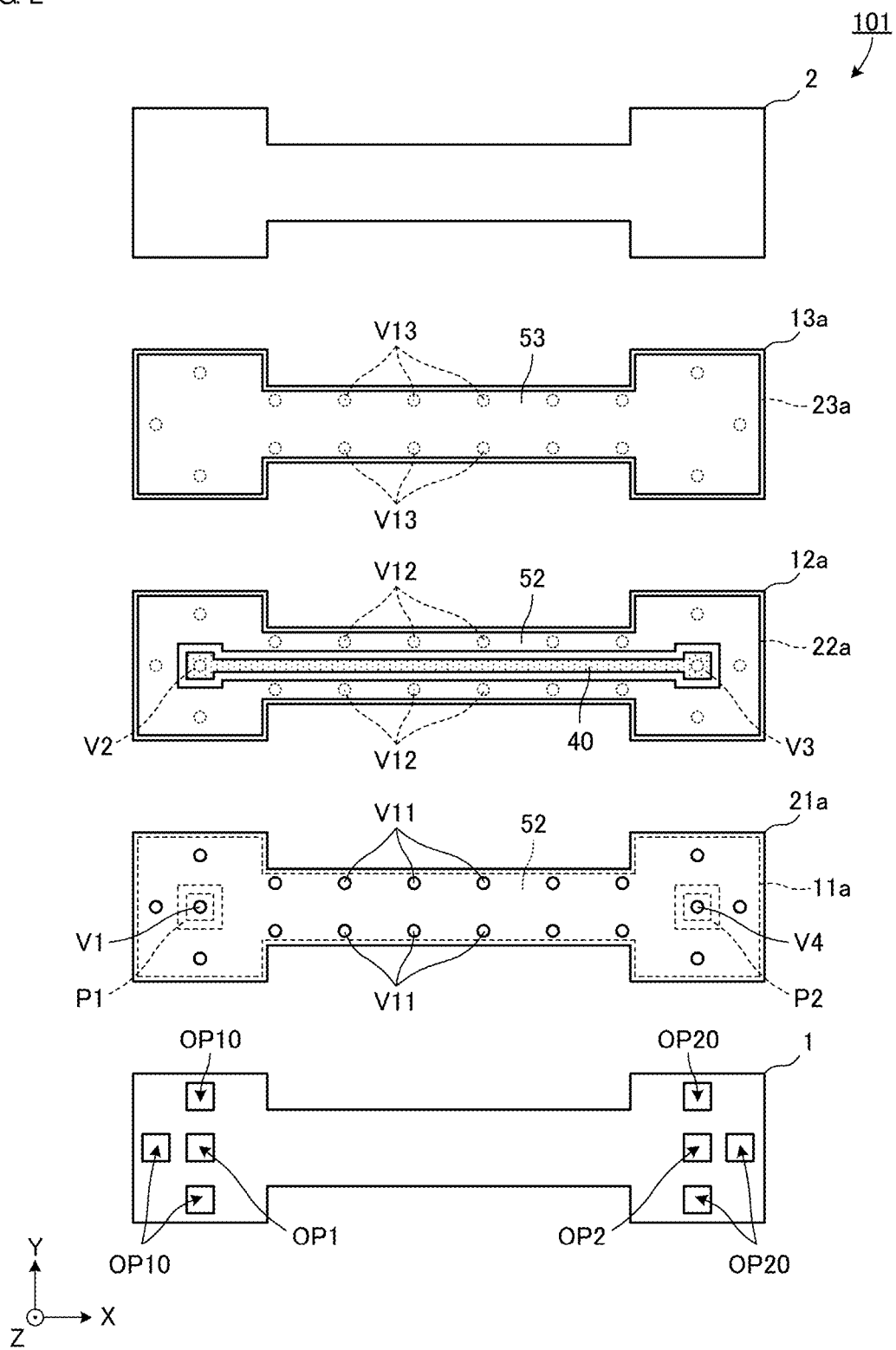
FIG. 2 is an exploded plan view of the resin multilayer substrate 101.
Figure 3A:
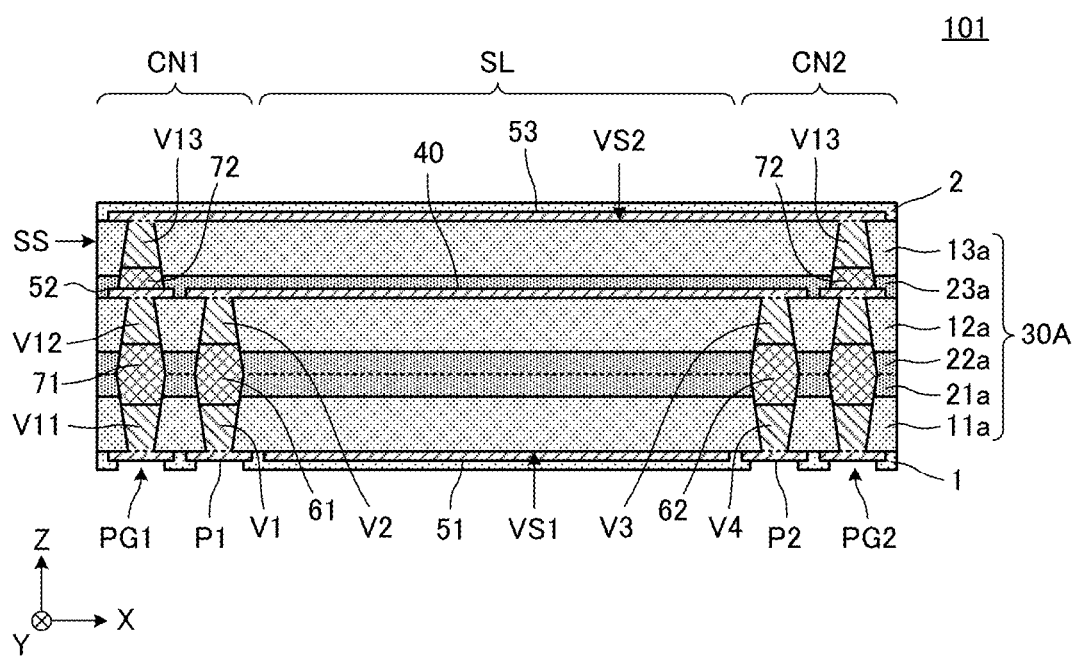
FIG. 3A is a sectional view of the resin multilayer substrate 101 taken along a line A-A.
Figure 3B:
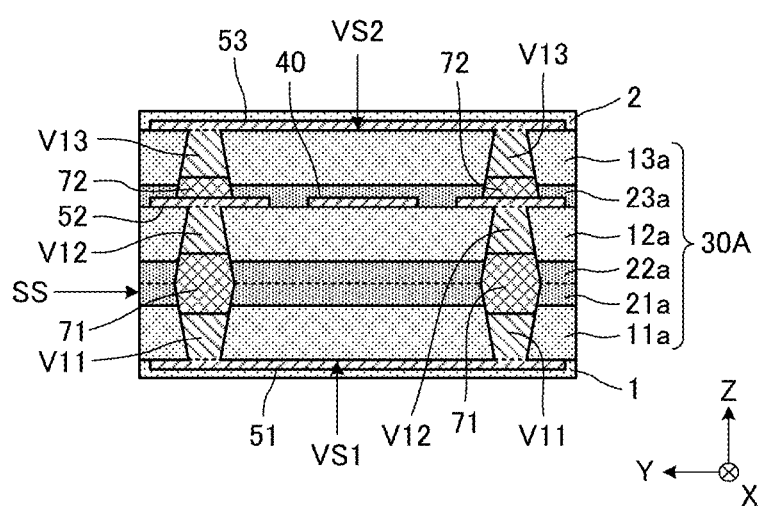
FIG. 3B is a sectional view taken along a line B-B in FIG. 1.

FIG. 1 is an external perspective view of a resin multilayer substrate 101 according to a first preferred embodiment of the present invention. FIG. 2 is an exploded plan view of the resin multilayer substrate 101. FIG. 3A is a sectional view taken along a line A-A in FIG. 1, and FIG. 3B is a sectional view taken along a line B-B in FIG. 1. In FIG. 2, a signal conductor 40 is shown by a dot pattern in order to facilitate the understanding of the structure.

As will be described below, the resin multilayer substrate 101 is, for example, a surface mount device mounted on a circuit board. The resin multilayer substrate 101 includes a first connection portion CN1, a second connection portion CN2, and a line portion SL. The first connection portion CN1, the line portion SL, and the second connection portion CN2 are provided in that order in a +X-direction. In the first connection portion CN1, a mounting electrode P1 and a ground electrode PG1 are exposed on a lower surface (a first principal surface VS1) illustrated in FIG. 1, and in the second connection portion CN2, a mounting electrode P2 and a ground electrode PG2 are exposed on the lower surface illustrated in FIG. 1. As will be described below, in the line portion SL, a transmission line to connect the first connection portion CN1 and the second connection portion CN2 is provided.

The resin multilayer substrate 101 includes a multilayer body 30A, the signal conductor 40, the mounting electrodes P1 and P2, the ground electrodes PG1 and PG2, ground conductors 51, 52, and 53, via conductors V1, V2, V3, V4, V11, V12, and V13, bonding portions 61, 62, 71, and 72, protective layers 1 and 2, and the like.

The multilayer body 30A is a flat plate having a rectangular or substantially rectangular shape in which the longitudinal direction thereof coincides with the X-axis direction. The multilayer body 30A has the first principal surface VS1 and a second principal surface VS2 opposing each other, and a side surface SS adjacent to the first principal surface VS1 and the second principal surface VS2. The first principal surface VS1 and the second principal surface VS2 are surfaces orthogonal or substantially orthogonal to a lamination direction (Z-axis direction). On the first principal surface VS1 of the multilayer body 30A, the protective layer 1, the ground conductor 51, and the mounting electrodes P1 and P2 are provided. On the second principal surface VS2 of the multilayer body 30A, the protective layer 2 and the ground conductor 53 are provided. Inside the multilayer body 30A, the signal conductor 40, the ground conductor 52, the via conductors V1, V2, V3, V4, V11, V12 and V13, and the bonding portions 61, 62, 71, and 72 are provided.

The multilayer body 30A is provided by laminating resin layers 11a, 12a and 13a, and adhesive layers 21a, 22a, and 23a. Specifically, the multilayer body 30A is provided by laminating the resin layer 11a, the adhesive layers 21a and 22a, the resin layer 12a, the adhesive layer 23a, and the resin layer 13a in that order.

Each of the resin layers 11a, 12a and 13a, and the adhesive layers 21a, 22a and 23a is a flat plate having a rectangular or substantially rectangular shape whose longitudinal direction coincides with the X-axis direction, and includes a thermoplastic resin. The resin layers 11a, 12a, and 13a are resin sheets preferably including, as a main component, fluororesin such as perfluoroalkoxy alkane (PFA), polytetrafluoroethylene (PTFE), or the like. The adhesive layers 21a, 22a, and 23a are resin sheets including, as a main component, a liquid crystal polymer (LCP) or polyetheretherketone (PEEK), for example.

The resin layers 11a, 12a, and 13a according to the present preferred embodiment have a higher gas permeability than the adhesive layers 21a, 22a, and 23a. In the present preferred embodiment, the resin layers 11a, 12a, and 13a correspond to "gas high-permeable layers", and the adhesive layers 21a, 22a, and 23a correspond to "gas low-permeable layers". Note that "a substance B has a higher gas permeability than a substance A" means, for example, that "the substance B has a higher gas permeability coefficient than the substance A". The gas permeability coefficient is measured by, for example, a differential pressure method (JIS K 7126-1), an isobaric method (JIS K 7126-2), or the like defined by the JIS standard.

On the rear surface of the resin layer 11a, the mounting electrodes P1 and P2, and the ground conductor 51 are provided. The mounting electrode P1 is a rectangular or substantially rectangular conductor pattern provided adjacent to or in a vicinity of a first end of the resin layer 11a (the left end of the resin layer 11a in FIG. 2). The mounting electrode P2 is a rectangular or substantially rectangular conductor pattern provided adjacent to or in a vicinity of a second end of the resin layer 11a (the right end of the resin layer 11a in FIG. 2). The ground conductor 51 is a planar conductor pattern provided on the entire or substantially the entire surface of the resin layer 11a. The mounting electrodes P1 and P2, and the ground conductor 51 are conductor patterns preferably including, for example, Cu foil. The adhesive layer 21a having the same or substantially the same shape as that of the resin layer 11a is pasted onto the surface of the resin layer 11a.

In the resin layer 11a, the via conductors V1 and V4, and a plurality of via conductors V11 are provided. The via conductor V1 is provided adjacent to or in a vicinity of the first end of the resin layer 11a, and the via conductor V4 is provided adjacent to or in a vicinity of the second end of the resin layer 11a. Each of the plurality of via conductors V11 is provided in a transmission direction (X-axis direction). Each of the via conductors V1, V4, and V11 is, for example, through-hole plating or filled-via plating of Cu or the like provided by plating treatment in a through-hole provided in the resin layer 11a and the adhesive layer 21a.

On the surface of the resin layer 12a, the signal conductor 40 and the ground conductor 52 are provided. The signal conductor 40 is a linear conductor pattern extending in the transmission direction (X-axis direction). The ground conductor is a planar conductor pattern provided on the entire or substantially the entire surface of the resin layer 12a. The signal conductor 40 and the ground conductor 52 are conductor patterns preferably including, for example, Cu foil. The adhesive layer 22a having the same or substantially the same shape as that of the resin layer 12a is pasted onto the rear surface of the resin layer 12a.

In the resin layer 12a, the via conductors V2 and V3, and a plurality of via conductors V12 are provided. The via conductor V2 is provided adjacent to or in a vicinity of a first end of the resin layer 12a (the left end of the resin layer 12a in FIG. 2), and the via conductor V3 is provided adjacent to in a vicinity of a second end of the resin layer 12a (the right end of the resin layer 12a in FIG. 2). Each of the plurality of via conductors V12 is provided in the transmission direction (X-axis direction). The via conductor V12 is preferably, for example, through-hole plating or filled-via plating of Cu or the like provided by plating treatment in a through-hole provided in the resin layer 12a and the adhesive layer 22a.

As illustrated in FIGS. 3A and 3B, the bonding portions 61 and 62, and a plurality of bonding portions 71 are provided in the adhesive layers 21a and 22a. The bonding portion 61 is connected to the via conductors V1 and V2, and the bonding portion is connected to the via conductors V3 and V4. The bonding portion 71 is connected to the via conductors V11 and V12. The bonding portions 61, 62, and 71 are, for example, low melting point conductive bonding structures including a metal material, for example, Cu or Sn, and a resin material.

On the surface of the resin layer 13a, the ground conductor 53 is provided. The ground conductor 53 is a planar conductor pattern provided on the entire or substantially the entire surface of the resin layer 13a. The ground conductor 53 is a conductor pattern preferably including, for example, Cu foil. The adhesive layer 23a having the same or substantially the same shape as that of the resin layer 13a is pasted onto the rear surface of the resin layer 13a.

In the resin layer 13a, a plurality of via conductors V13 are provided. Each of the plurality of via conductors V13 is provided in the transmission direction (X-axis direction). The via conductor V13 is preferably, for example, through-hole plating or filled-via plating of Cu or the like provided by plating treatment in a through-hole provided in the resin layer 13a and the adhesive layer 23a.

As illustrated in FIGS. 3A and 3B, a plurality of bonding portions 72 are provided in the adhesive layer 23a. Each of the bonding portions 72 is connected to the ground conductor 52 and the via conductor V13. The bonding portion 72 is, for example, a low melting point conductive bonding structure including a metal material, for example, Cu or Sn, and a resin material.

The protective layer 1 is laminated on the rear surface of the resin layer 11a, and a planar shape thereof is the same or substantially the same as that of the resin layer 11a. The protective layer 2 is laminated on the surface of the resin layer 13a, and a planar shape thereof is the same or substantially the same as that of the resin layer 13a. The protective layers 1 and 2 have a lower gas permeability than the resin layers 11a, 12a, and 13a (gas high-permeable layers). The protective layers 1 and 2 are a coverlay film preferably of, for example, polyimide (PI) or polyethylene terephthalate (PET), or a solder resist film including, for example, an epoxy resin (EP) as a main component.

As illustrated in FIG. 2, the protective layer 1 includes openings OP1 and OP2, and pluralities of openings OP10 and openings OP20. The opening OP1 is provided at a position corresponding to a position of the mounting electrode P1, and the opening OP2 is provided at a position corresponding to a position of the mounting electrode P2. Due to this, even when the protective layer 1 is provided on the rear surface of the resin layer 11a, the mounting electrode P1 is exposed to the outside through the opening OP1, and the mounting electrode P2 is exposed to the outside through the opening OP2. The pluralities of openings OP10 and openings OP20 are provided at positions corresponding to a position of the ground conductor 51. Due to this, even when the protective layer 1 is provided on the rear surface of the resin layer 11a, portions of the ground conductor 51 are exposed to the outside through the openings OP10 and OP20. In the present preferred embodiment, a portion of the ground conductor 51 exposed through the plurality of openings OP10 is the ground electrode PG1, and a portion of the ground conductor 51 exposed through the plurality of openings OP20 is the ground electrode PG2.

As illustrated in FIG. 3A, the mounting electrode P1 is connected to one end of the signal conductor 40 via the via conductors V1 and V2, and the bonding portion 61. The other end of the signal conductor 40 is connected to the mounting electrode P2 via the via conductors V3 and V4, and the bonding portion 62. Accordingly, the mounting electrodes P1 and P2 are electrically connected to each other. As illustrated in FIG. 3B, the ground conductor 51 (ground electrodes PG1 and PG2) is connected to the ground conductor 52 via the via conductors V11 and V12, and the bonding portion 71. The ground conductor 52 is connected to the ground conductor 53 via the via conductor V13 and the bonding portion 72.

In the present preferred embodiment, a transmission line of a strip line structure including the signal conductor 40, the ground conductors 51 and 53, the resin layers 11a and 12a as well as the adhesive layers 21a and 22a sandwiched between the signal conductor 40 and the ground conductor 51, and the resin layer 13a as well as the adhesive layer 23a sandwiched between signal conductor 40 and the ground conductor 53 is provided.

At least a portion of each of the bonding portions 61, 62, 71, and 72 contacts the gas high-permeable layer. Specifically, as illustrated in FIGS. 3A and 3B, at least a portion of each of the bonding portions 61, 62, and 71 is in contact with the resin layers 11a and 12a (gas high-permeable layers). In addition, at least a portion of the bonding portion 72 is in contact with the resin layer 13a (gas high-permeable layer).

In the present preferred embodiment, the bonding portions 61, 62, 71, and 72 are conductive bonding structures including a metal material and a resin material, and include an organic substance (e.g., carbon). The bonding portions 61, 62, 71, and 72 each include a larger amount of organic substance than the via conductor provided by plating treatment, and therefore, are likely to generate a gas when heated. Therefore, the amount of gas generated in the bonding portions 61, 62, 71, and 72 when heated is larger than the amount of gas generated in the via conductors V1, V2, V3, V4, V11, V12, and V13 when heated. A large number of voids are provided as marks of the gas generation in each of the bonding portions 61, 62, 71, and 72 (a void content rate is high). Therefore, the void content rate of the bonding portions 61, 62, 71, and 72 is higher than that of the via conductors V1, V2, V3, V4, V11, V12, and V13. Specifically, a void content rate (PR1) per unit plane sectional area of each of the bonding portions 61, 62, 71, and 72 (per unit area in an X-Y plane of each bonding portion) is higher than a void content rate (PR2) per unit plane sectional area of each of the via conductors V1, V2, V3, V4, V11, V12, and V13 (PR1>PR2).

The conductive bonding structure of the bonding portion is provided by solidifying a conductive paste including a metal having a low melting point. In a case where a resin multilayer substrate is used as a high-frequency transmission line or the like, for a wiring conductor, Cu or the like with small conductor loss is preferably included, for example, but the melting point of Cu is high. To deal with this, an approach is taken in which a Cu—Sn based intermetallic compound is provided between Cu and a Cu paste, a Cu—Sn based conductive paste, or the like having a lower melting point than Cu. Since an intermetallic compound is provided at a connecting portion between the via conductor, which is a plated via, and the bonding portion, which is a conductive bonding structure, it is difficult to accurately determine an interface between the via conductor and the bonding portion. The interface between the bonding portion and the via conductor is determined by any one of methods (1) and (2) described below.

Figure 4A:
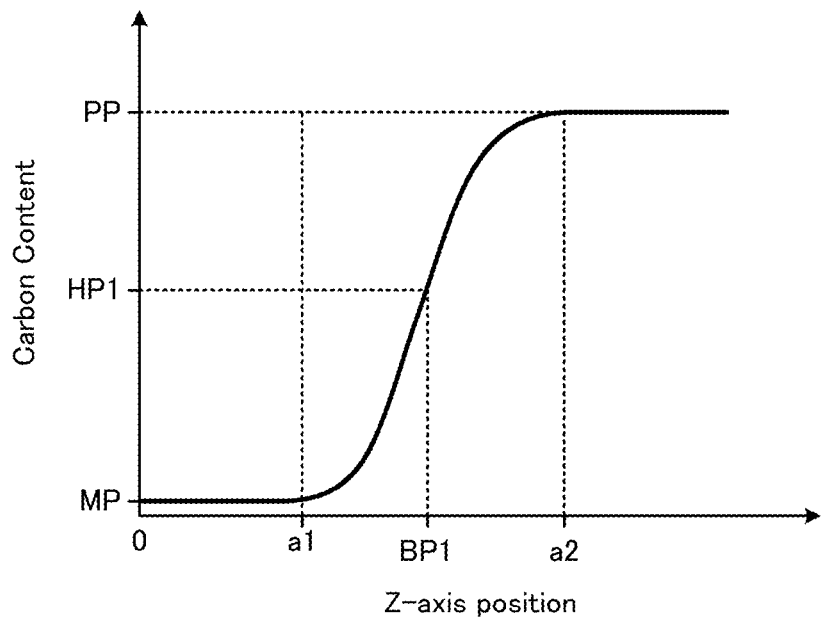
FIG. 4A is a graph illustrating a carbon content rate in a Z-axis direction near an interface between a via conductor and a bonding portion.
Figure 4B:
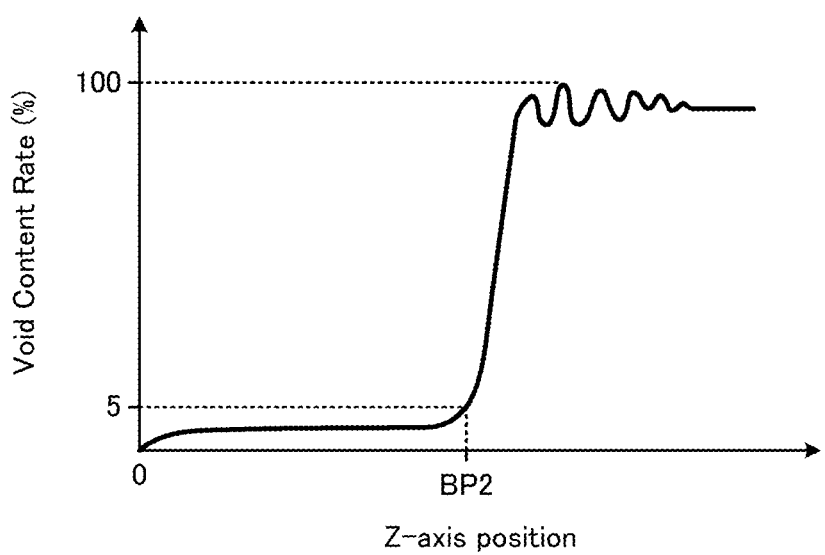
FIG. 4B is a graph illustrating a void content rate per unit plane sectional area in the Z-axis direction near the interface between the via conductor and the bonding portion.

FIG. 4A is a graph illustrating a carbon content rate in a Z-axis direction near an interface between the via conductor and the bonding portion, and FIG. 4B is a graph illustrating a void content rate per unit plane sectional area in the Z-axis direction near the interface between the via conductor and the bonding portion. In FIGS. 4A and 4B, the via conductor and the bonding portion are bonded to each other in the Z-axis direction, and the via conductor and the bonding portion are provided in that order in a +Z-direction. That is, in FIGS. 4A and 4B, the composition changes from the "via conductor" to the "bonding portion" toward the +Z-direction side.

(1) Method for Determining Interface Between Via Conductor and Bonding Portion by Carbon Content Rate As described above, since the bonding portion includes an organic substance, the carbon content rate in the bonding portion is high. Accordingly, for example, as illustrated in FIG. 4A, an intermediate position (BP1) of a distance (L=a2−a1) in the Z-axis direction from a point a1 at which the carbon content rate starts to increase from a minimum value (MP), to a point a2 at which the carbon content rate reaches a maximum value (PP) is defined as the interface between the via conductor and the bonding portion (BP1=a1+(a2−a1)/2).

(2) Method for Determining Interface Between Via Conductor and Bonding Portion by Void Content Rate As described above, the void content rate per unit plane sectional area of a bonding portion (PR1) is higher than the void content rate per unit plane sectional area of a via conductor (PR2) (PR1>PR2). Accordingly, for example, when it is assumed that a maximum value of the void content rate per unit plane sectional area is 100%, and a Z-axis position moves in the +Z-direction as illustrated in FIG. 4B, a position (BP2) at which the void content rate per unit plane sectional area exceeds about 5% of the above maximum value is defined as the interface between the via conductor and the bonding portion.

As illustrated in FIGS. 3A and 3B, the resin layers 11a, 12a, and 13a (gas high-permeable layers) are exposed to the side surface SS of the multilayer body 30A. A thickness (T1: thickness in the Z-axis direction) of the resin layers 11a, 12a, and 13a (gas high-permeable layers) is thicker than a thickness (T2) of the adhesive layers 21a, 22a, and 23a (gas low-permeable layers) (T1>T2).

In the present preferred embodiment, a thickness (thickness in the Z-axis direction) (D1) of the via conductors V1, V2, V3, V4, V11, V12, and V13 is thicker than a thickness (D2) of the bonding portions 61, 62, 71, and 72 (D1>D2).

In the present preferred embodiment, a relative dielectric constant (ε1) of the resin layers 11a, 12a, and 13a (gas high-permeable layers) is lower than a relative dielectric constant (ε2) of the adhesive layers 21a, 22a, and 23a (gas low-permeable layers) (ε1<ε2). Further, in the present preferred embodiment, a dielectric loss tangent (tan δ1) of the resin layers 11a, 12a, and 13a is smaller than a dielectric loss tangent (tan δ2) of the adhesive layers 21a, 22a, and 23a (tan δ1<tan δ2).

Figure 5:
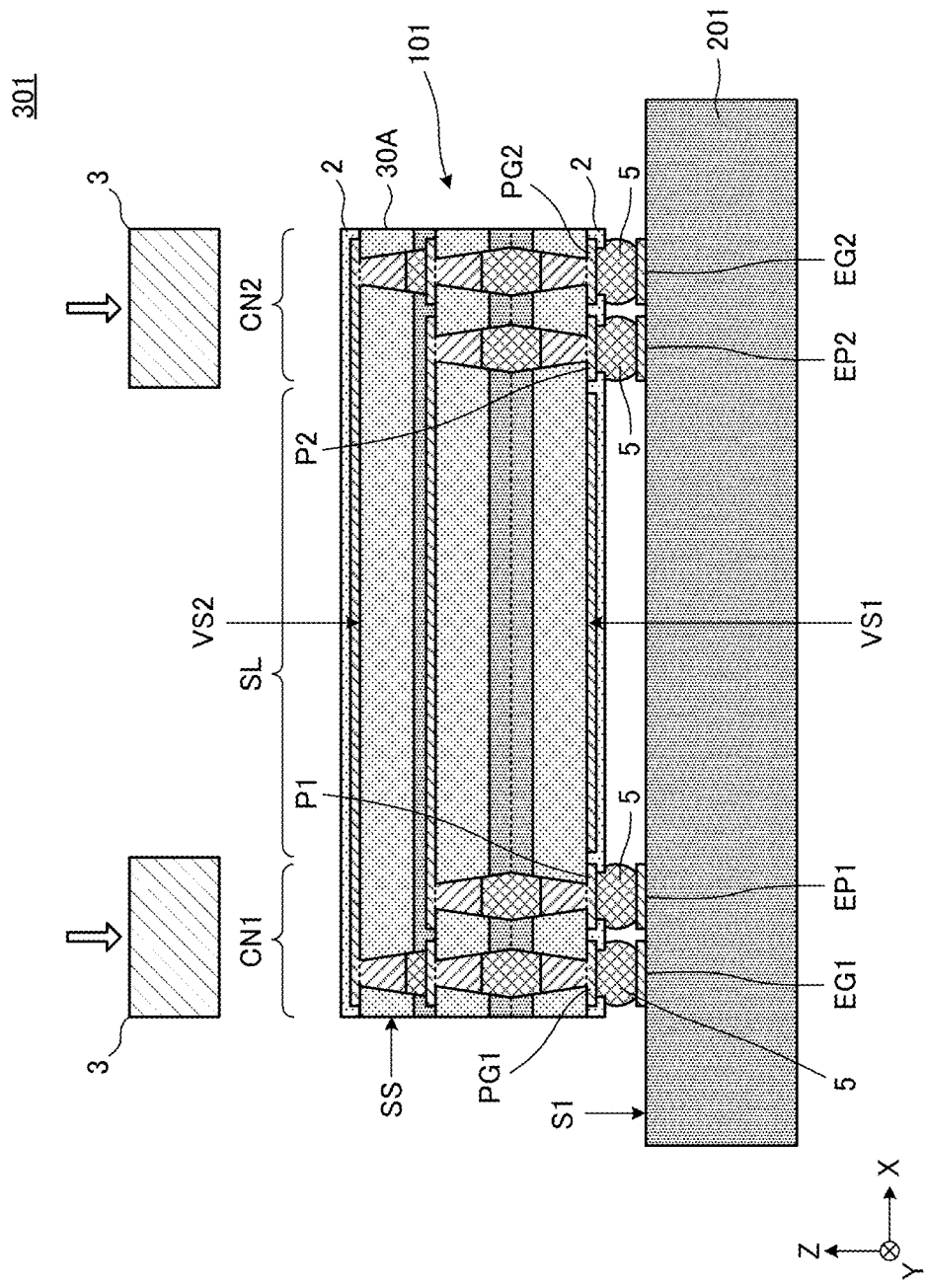
FIG. 5 is a sectional view illustrating a main section of an electronic apparatus 301 according to the first preferred embodiment of the present invention.

The resin multilayer substrate 101 is used, for example, as follows. FIG. 5 is a sectional view illustrating a main section of an electronic apparatus 301 according to the first preferred embodiment.

The electronic apparatus 301 includes the resin multilayer substrate 101, a circuit board 201, and the like. The electronic apparatus 301 includes other features and elements than the features and elements described above, but the other features and elements are not illustrated in FIG. 5. In the present preferred embodiment, the circuit board 201 is an example of "another structure".

The circuit board 201 has a first surface S1. Outer electrodes EP1, EP2, EG1, and EG2 are provided on the first surface S1 of the circuit board 201. The circuit board 201 is, for example, a glass epoxy board.

The resin multilayer substrate 101 is surface-mounted on the circuit board 201 by a hot bar or the like (or by a reflow process), for example. The mounting electrode P1 of the resin multilayer substrate 101 is connected to the outer electrode EP1 of the circuit board 201 via a conductive bonding structure 5, for example, solder. The mounting electrode P2 of the resin multilayer substrate 101 is connected to the outer electrode EP2 of the circuit board 201 via the conductive bonding structure 5. The ground electrode PG1 of the resin multilayer substrate 101 is connected to the outer electrode EG1 of the circuit board 201 via the conductive bonding structure 5. The ground electrode PG2 of the resin multilayer substrate 101 is connected to the outer electrode EG2 of the circuit board 201 via the conductive bonding structure 5. Although not illustrated, other chip components and the like are also mounted on the first surface S1 of the circuit board 201.

With the resin multilayer substrate 101 according to the present preferred embodiment, the following advantageous effects are provided.

In the resin multilayer substrate 101 according to the present preferred embodiment, since the resin layers 11a, 12a, and 13a are gas high-permeable layers, a gas generated in the multilayer body 30A when heated (for example, during the formation of the multilayer body, during the mounting of the resin multilayer substrate by a reflow process, during the mounting of the resin multilayer substrate by a hot bar or the like, or during a bending process involving heating), or a gas remaining in the multilayer body 30A is likely to be discharged to the outside as compared with a multilayer body provided by laminating only gas low-permeable layers.

Each of the bonding portions 61, 62, 71, and 72 including the resin material generates a larger amount of gas when heated than the via conductor. On the other hand, in the resin multilayer substrate 101, at least a portion of each of the bonding portions 61, 62, 71, and 72 is brought into contact with the gas high-permeable layer (resin layer), and thus the gas generated in the multilayer body 30A when heated or the gas remaining in the multilayer body 30A is able to be efficiently discharged to the outside. Therefore, the interlayer peeling of the resin multilayer substrate 101 when heated is reduced or prevented, and as a result, flatness of the surface of the multilayer body is secured even when being heated.

In the present preferred embodiment, the thickness (T1) of the resin layers 11a, 12a, and 13a (gas high-permeable layers) is thicker than the thickness (T2) of the adhesive layers 21a, 22a, and 23a (gas low-permeable layers) (T1>T2). Accordingly, the gas generated in the multilayer body 30A when the resin multilayer substrate is heated, or the gas remaining in the multilayer body 30A, is able to be easily discharged to the outside.

In the present preferred embodiment, the protective layers 1 and 2 having a lower gas permeability than the gas high-permeable layers (the resin layers 11a, 12a, and 13a) are provided on the first principal surface VS1 and the second principal surface VS2 of the multilayer body 30A, respectively. When the resin multilayer substrate is heated (for example, when the resin multilayer substrate is mounted by a reflow process, when the resin multilayer substrate is mounted by a hot bar or the like, or when the resin multilayer substrate is bent while being heated), the gas remaining in the multilayer body 30A is unlikely to be discharged to the outside, but in the resin multilayer substrate 101, the gas high-permeable layer is exposed to the side surface SS of the multilayer body 30A. With this, even when the protective layer 1 or 2 with low gas permeability is provided on the first principal surface VS1 or the second principal surface VS2 of the multilayer body 30A, the gas remaining in the multilayer body 30A is able to be discharged from a side portion of the gas high-permeable layer to the outside when the resin multilayer substrate is heated.

In the present preferred embodiment, each of the via conductors V1, V2, V3, V4, V11, V12, and V13 is, for example, through-hole plating (or filled-via plating) of Cu or the like provided by plating, and includes the same or substantially the same material as that of the planar conductors (the mounting electrodes P1 and P2, signal conductor 40, and ground conductors 51, 52, and 53). Accordingly, the via conductor and the planar conductor are integrated. Accordingly, an intermetallic compound is unlikely to be provided at a connecting portion between the via conductor and the planar conductor, and mechanical strength of the connecting portion between the via conductor and the planar conductor increases.

In the present preferred embodiment, the thickness (D1) of the via conductors V1, V2, V3, V4, V11, V12, and V13 is thicker than the thickness (D2) of the bonding portions 61, 62, 71, and 72 (D1>D2). Accordingly, the conductor loss of a circuit provided in or on the resin multilayer substrate is able to be reduced or prevented as compared with the case where the thickness of the bonding portion is thicker than the thickness of the via conductor. That is, the amount of gas that is generated when heated is able to be reduced or prevented, and a resin multilayer substrate that is excellent in high-frequency characteristics is able to be provided.

In the present preferred embodiment, the multilayer body 30A is provided including the resin layers 11a, 12a, and 13a more excellent in high-frequency characteristics than the adhesive layers 21a, 22a, and 23a, and thus a resin multilayer substrate excellent in high-frequency characteristics is able to be provided. To be specific, the relative dielectric constant ($\varepsilon 1$) of the resin layers 11a, 12a, and 13a (gas high-permeable layers) is lower than the relative dielectric constant ($\varepsilon 2$) of the adhesive layers 21a, 22a, and 23a (gas low-permeable layers) ($\varepsilon 1 < \varepsilon 2$). Accordingly, when a circuit having predetermined characteristics is provided in or on the resin multilayer substrate, the line width of the conductor patterns (for example, the signal conductor 40) provided in the multilayer body 30A are able to be widened, and thus the conductor loss of the circuit is able to be reduced or prevented. In addition, when a circuit having predetermined characteristics is provided in or on the resin multilayer substrate, the resin layer is able to be thinned even when the line width of the conductor pattern is not thinned, and thus the multilayer body 30A is able to be thinned. Further, in the present preferred embodiment, the dielectric loss tangent (tan $\delta 1$) of the resin layers 11a, 12a, and 13a is smaller than the dielectric loss tangent (tan $\delta 2$) of the adhesive layers 21a, 22a, and 23a (tan $\delta 1 <$ tan $\delta 2$). Accordingly, the dielectric loss tangent is able to be reduced as compared with a multilayer body provided by laminating only the layers having a relatively high dielectric loss tangent.

In the present preferred embodiment, as illustrated in FIGS. 3A and 3B, the resin layer 12a excellent in high-frequency characteristics is located at a position in contact with the signal conductor 40. Accordingly, the high-frequency characteristics of the resin multilayer substrate are able to be improved.

In the present preferred embodiment, the resin layers 11a, 12a, 13a and the adhesive layers 21a, 22a, 23a defining the multilayer body 30A all include a thermoplastic resin. Accordingly, as will be described below, the multilayer body 30A is able to be easily provided by applying a heating press (batch press) to the laminated resin layers 11a, 12a, 13a and adhesive layers 21a, 22a, 23a. Thus, the manufacturing process of the resin multilayer substrate 101 is reduced, and the cost is able to be reduced to a low level. Accordingly, a resin multilayer substrate able to plastically deform with ease and maintain (keep) a predetermined shape is able to be provided.

In the present preferred embodiment, a resin material is included in the bonding portions 61, 62, 71, and 72 provided in the adhesive layer, and thus excellent bonding properties with respect to the adhesive layer (or the resin layer) including resin as a main component may be provided. Preferably, for example, the resin material included in the bonding portions 61, 62, 71, and 72 is the same or substantially the same type as that the resin material of the adhesive layer (or the resin layer) in contact with the bonding portions 61, 62, 71, and 72.

In the present preferred embodiment, the interface between the via conductor and the bonding portion is located in the resin layer, that is, in the gas high-permeable layer. Accordingly, the gas generated at the interface between the via conductor and the bonding portion may be efficiently discharged.

In the present preferred embodiment, an example in which the bonding portions 61, 62, 71, and 72 are conductive bonding structures each including a resin material and a metal material, for example, Cu or Sn is described, but the bonding portion is not limited thereto. The bonding portion may be, for example, an interlayer conductor provided by solidifying a conductive paste including metal powder (metal powder of at least one of Cu and Sn, or metal powder of an alloy of these metals) and a resin material. The interlayer conductors are able to be simultaneously provided by applying heating press processing (to be described below) to the laminated resin layers and adhesive layers, and therefore are able to be provided with ease.

Figure 6:
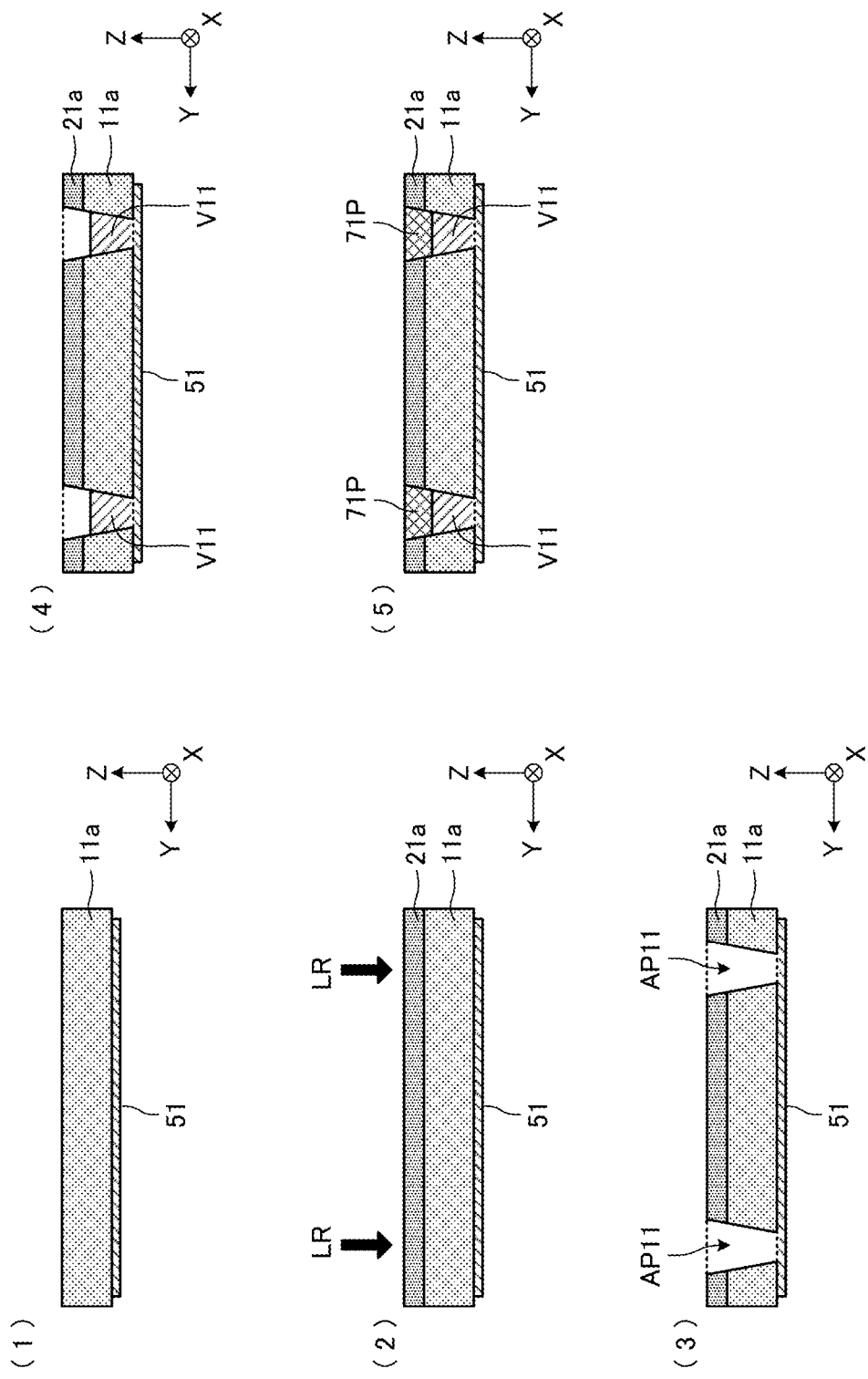
FIG. 6 includes sectional views illustrating a process of forming a ground conductor 51, a via conductor, and a bonding portion 71P in sequence in a resin layer 11a and an adhesive layer 21a before a heating press.
Figure 7:
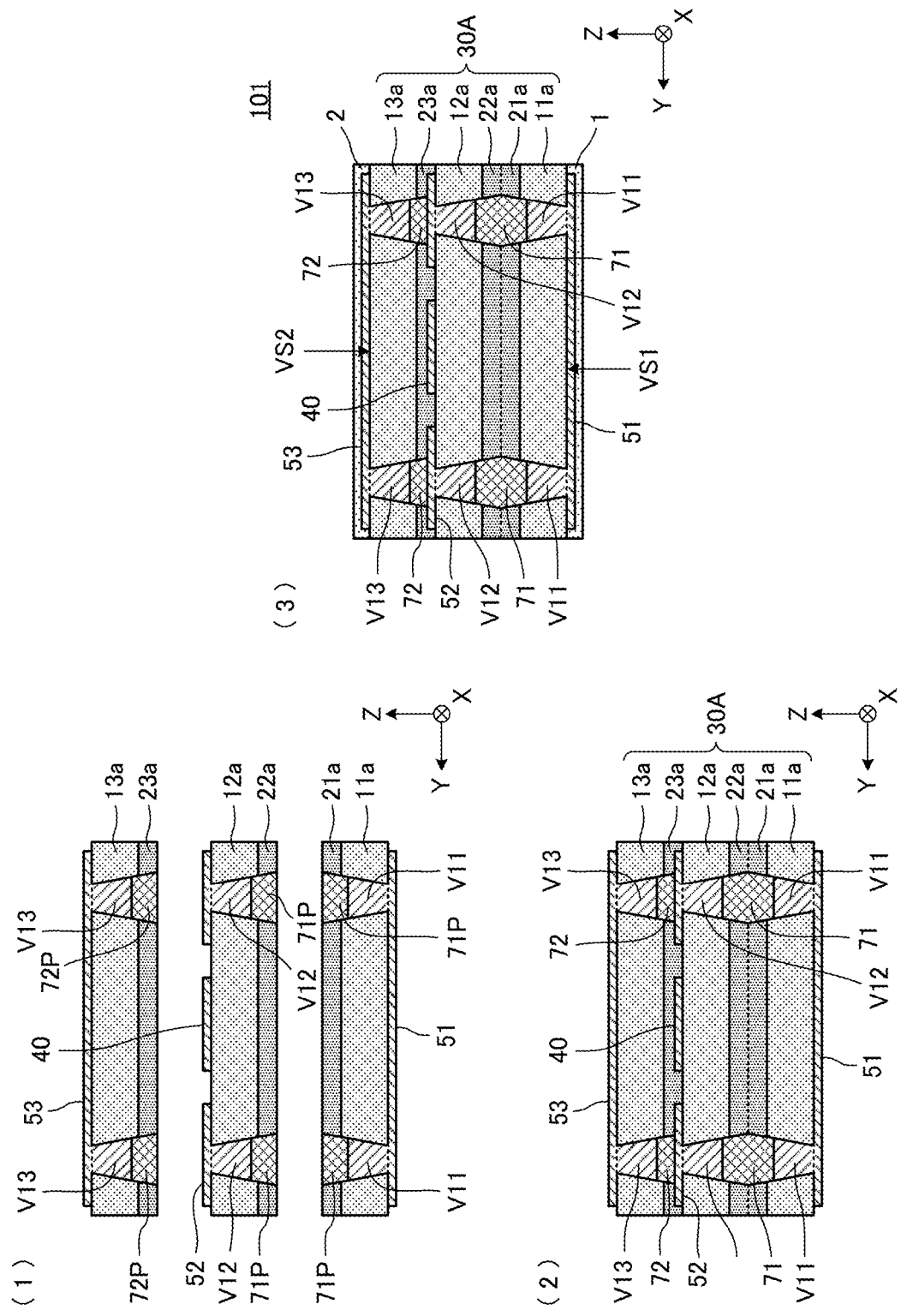
FIG. 7 includes sectional views sequentially illustrating a manufacturing process of the resin multilayer substrate 101.

The resin multilayer substrate 101 according to the present preferred embodiment is manufactured, for example, by a non-limiting example of a manufacturing method as described below. FIG. 6 includes sectional views illustrating a process of forming the ground conductor 51, the via conductor V11, and the bonding portion 71P in sequence in the resin layer 11a and the adhesive layer 21a before the heating press. FIG. 7 includes sectional views sequentially illustrating a manufacturing process for the resin multilayer substrate 101.

In FIGS. 6 and 7, for convenience of description, a manufacturing process for one chip (piece) is described, but the actual manufacturing process for the resin multilayer substrate 101 is performed in a collective board state. The "collective board" refers to a board including a plurality of the resin multilayer substrates 101. The process for the resin layers 12a, 13a and the adhesive layers 22a, 23a is the same as or similar to the process for the resin layer 11a and the adhesive layer 21a illustrated in FIG. 6, and therefore description thereof is omitted. This applies also to sectional views in the manufacturing method described below.

First, as illustrated in (1) of FIG. 6, the resin layer 11a including a thermoplastic resin is prepared, and the ground conductor 51 and the like are provided on the rear surface of the resin layer 11a. Specifically, metal foil (Cu foil) is laminated on the rear surface of the resin layer 11a, and the laminated metal foil is patterned by, for example, photolithography, and thus the ground conductor 51 and the like are provided on the rear surface of the resin layer 11a.

The resin layer 11a is a resin sheet preferably including, as a main component, fluororesin, for example, perfluoroalkoxy alkane (PFA), polytetrafluoroethylene (PTFE), or the like.

Subsequently, as illustrated in (2) of FIG. 6, the surface of the resin layer 11a and the rear surface of the adhesive layer 21a including a thermoplastic resin are pasted to each other. The adhesive layer 21a is a layer (gas low-permeable layer) having a lower gas permeability than the resin layer 11a.

The adhesive layer 21a is a resin sheet preferably including, as a main component, a liquid crystal polymer (LCP) or polyetheretherketone (PEEK), for example.

Subsequently, as illustrated in (3) of FIG. 6, a through-hole AP11 passing through the pasted resin layer 11a and adhesive layer 21a is provided. The through-hole AP11 is provided by, for example, irradiating a laser LR from the surface side of the adhesive layer 21a. The through-hole AP11 may be provided by grinding, polishing, and etching, for example, by a drill or the like.

Thereafter, as illustrated in (4) of FIG. 6, at least the resin layer 11a side of the through-hole AP11 is filled with a metal material (e.g., Cu or the like), thus forming the via conductor V11. Specifically, a plated film is formed on the surface of the ground conductor 51 in the through-hole AP11 and on the inner wall of the through-hole AP11 by plating treatment.

Subsequently, as illustrated in (5) of FIG. 6, the bonding portion 71P is provided at least on the adhesive layer 21a side of the through-hole AP11 to contact with the via conductor V11. Specifically, the bonding portion 71P is applied onto the surface of the via conductor V11 (the upper surface of the via conductor V11 illustrated in (4) and (5) of FIG. 6). The bonding portion 71P is, for example, a conductive paste including a metal material, for example, Cu or Sn, and a resin material.

Subsequently, as illustrated in (1) of FIG. 7, the resin layers 11a, 12a, 13a and the adhesive layers 21a, 22a, 23a are laminated (set). Specifically, the resin layer 11a, the adhesive layers 21a and 22a, the resin layer 12a, the adhesive layer 23a, and the resin layer 13a are laminated in that order. At this time, the bonding portion 71P formed in the adhesive layer 21a and the bonding portion 71P formed in the adhesive layer 22a are brought into contact with each other. Further, a bonding portion 72P formed in the adhesive layer 23a and the ground conductor 52 formed in the resin layer 12a are brought into contact with each other.

Thereafter, the multilayer body 30A illustrated in (2) of FIG. 7 is formed by applying a heating press (batch press) to the laminated resin layers 11a, 12a, 13a and adhesive layers 21a, 22a, 23a in the lamination direction (Z-axis direction). The bonding portion 71P solidifies due to heat at the time of heating press and cooling after the heating press, and thus the bonding portion 71 is formed. The bonding portion 72P solidifies due to the heat at the time of heating press and the cooling after the heating press, and thus the bonding portion 72 is formed.

Then, as illustrated in (3) of FIG. 7, the protective layer 1 is formed on the first principal surface VS1 of the multilayer body 30A, and the protective layer 2 is formed on the second principal surface VS2 of the multilayer body 30A. The protective layers 1 and 2 are a coverlay film preferably of, for example, polyimide (PI) or polyethylene terephthalate (PET), or a solder resist film including, for example, an epoxy resin (EP) as a main component.

Finally, the collective board is separated into individual pieces to provide the resin multilayer substrate 101.

By this manufacturing method, the gas generated in the multilayer body when heated or the gas remaining in the multilayer body is likely to be discharged to the outside, and the resin multilayer substrate in which the interlayer peeling and the like are reduced or prevented is able to be easily manufactured.

According to this manufacturing method, the multilayer body 30A may be easily formed by applying the batch press to the resin layers 11a, 12a, 13a and the adhesive layers 21a, 22a, 23a. Thus, the manufacturing process of the resin multilayer substrate 101 is reduced, and the cost is able to be reduced to a low level.

In the above-described manufacturing method, a method of forming the bonding portion by provided the conductive paste on the upper surface of the via conductor is described, but the preferred embodiments of the present invention are not limited thereto. The bonding portion may be formed as follows: for example, a conductive paste including metal powder (metal powder of at least one of Cu and Sn, or metal powder of an alloy of these metals) and a resin material is provided on the upper surface of the via conductor of the through-hole, and the conductive paste is solidified by the heating press (batch press) performed subsequently, thus forming the bonding portion.

Figure 8:
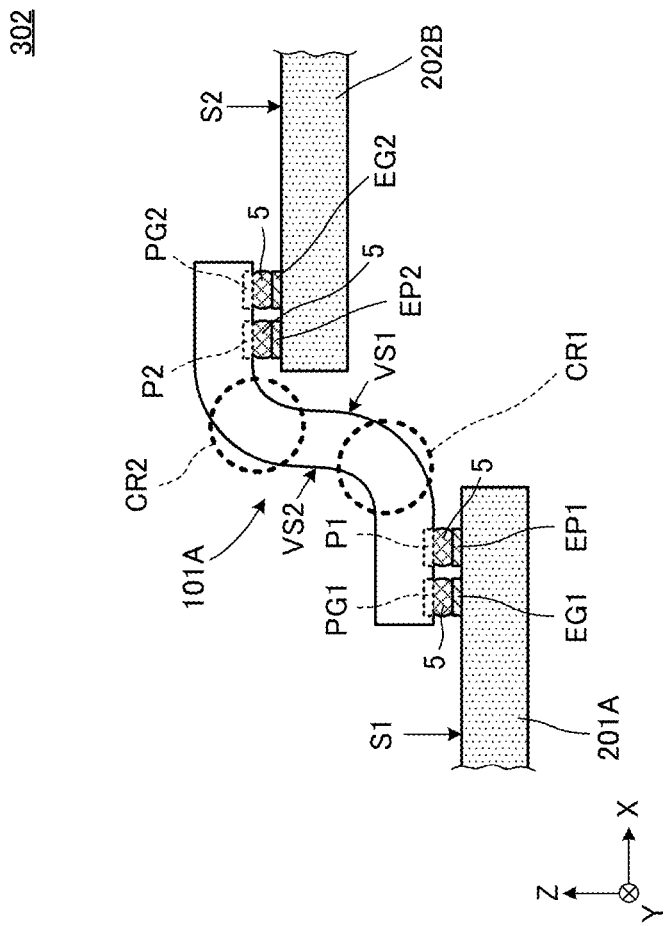
FIG. 8 is a front view illustrating a main section of an electronic apparatus 302 according to the first preferred embodiment of the present invention.

In the present preferred embodiment, an example in which the resin multilayer substrate 101 is surface-mounted on a circuit board is described, but the resin multilayer substrate is not limited to this use. The resin multilayer substrate may be used, for example, as follows. FIG. 8 is a front view illustrating a main section of an electronic apparatus 302 according to the first preferred embodiment.

The electronic apparatus 302 includes a resin multilayer substrate 101A, circuit boards 201A and 202A, and the like. The resin multilayer substrate 101A is different from the resin multilayer substrate 101 in that the multilayer body 30A includes bent portions CR1 and CR2 (having experienced a bending process). Other elements of the resin multilayer substrate 101A are the same as or similar to the elements of the resin multilayer substrate 101. The circuit boards 201A and 202A are preferably, for example, glass epoxy boards.

The circuit board 201A includes a first surface S1, and the circuit board 202A includes a second surface S2. As illustrated in FIG. 8, the first surface S1 and the second surface S2 are surfaces whose heights in the Z-axis direction are different from each other.

On the first surface S1 of the circuit board 201A, the outer electrodes EP1 and EG1 are provided. On the second surface S2 of the circuit board 202A, the outer electrodes EP2 and EG2 are provided.

The resin multilayer substrate 101A is mounted on the circuit boards 201A and 202A in a bent state. Specifically, the mounting electrode P1 of the resin multilayer substrate 101A is connected to the outer electrode EP1 of the circuit board 201A via the conductive bonding structure 5. The ground electrode PG1 of the resin multilayer substrate 101A is connected to the outer electrode EG1 of the circuit board 201A via the conductive bonding structure 5. The mounting electrode P2 of the resin multilayer substrate 101A is connected to the outer electrode EP2 of the circuit board 202A via the conductive bonding structure 5. The ground electrode PG2 of the resin multilayer substrate 101A is connected to the outer electrode EG2 of the circuit board 202A via the conductive bonding structure 5. Although not illustrated, other chip components and the like are mounted on the first surface S1 of the circuit board 201A and the second surface S2 of the circuit board 202A.

The resin multilayer substrate 101A is bent (plastically deformed) as described above to be easily mounted on the circuit boards 201A and 202A, whose surfaces are different in height in the Z-axis direction.

Figure 9:
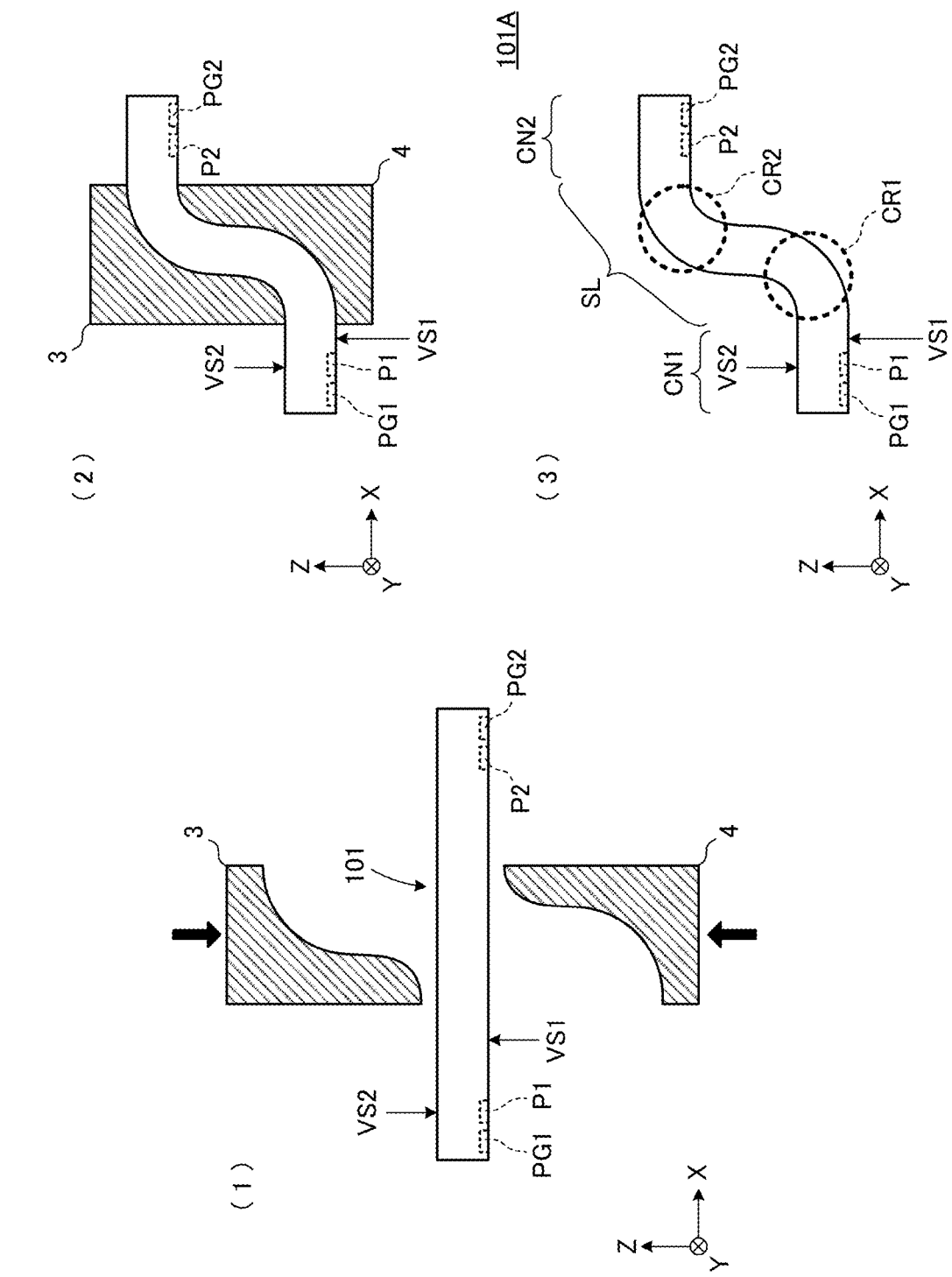
FIG. 9 includes front views sequentially illustrating a bending process of the resin multilayer substrate.

The bent resin multilayer substrate 101A is manufactured, for example, through the following process. FIG. 9 includes front views illustrating a bending process of the resin multilayer substrate 101.

First, as illustrated in (1) and (2) of FIG. 9, the resin multilayer substrate 101 is prepared, and the first principal surface VS1 and the second principal surface VS2 of the multilayer body 30A are heated and pressed in the Z-axis direction by an upper mold 3 and a lower mold 4. As illustrated in FIG. 9, a position to be heated and pressed is near the center in the longitudinal direction (Z-axis direction) of the multilayer body 30A. The upper mold 3 and the lower mold 4 are metal structures each having an L-shaped sectional shape.

After the multilayer body 30A formed of the thermoplastic resin is cooled and cured, the multilayer body 30A is removed from the upper mold 3 and the lower mold 4, thus providing the resin multilayer substrate 101A as illustrated in (3) of FIG. 9.

By the manufacturing method discussed above, the resin multilayer substrate 101A, which is bent (plastically deformed) and maintains (keeps) the bent shape, is provided. With the resin multilayer substrate according to the present preferred embodiment, a situation in which a gas remains in the multilayer body 30A is able to be reduced or prevented, and the generation of voids in the multilayer body 30A is also able to be reduced or prevented. Accordingly, the occurrence of interlayer peeling (delamination) started from the voids inside the multilayer body 30A during the bending process or the like is able to be reduced or prevented.

To reduce or prevent breakage of the bonding portions during the heating of the resin multilayer substrate (for example, during a reflow process or a bending process involving heating), at least a portion of the relatively brittle bonding portions 61, 62, 71, and 72 is preferably provided in the layers (adhesive layers 21a, 22a, and 23a) having a relatively small coefficient of linear expansion, for example. In other words, at least a portion of the bonding portions is preferably in contact with the layers having a relatively small coefficient of linear expansion, for example.

When a multilayer body is provided by heating and pressing a plurality of layers including different kinds of materials (resins), the bonding portions, in which low melting point materials are included, include more brittle materials than the via conductors. Accordingly, when a coefficient of linear expansion of the layer in contact with the bonding portion is large, stress may be applied to the bonding portion due to the expansion of the layer having a large coefficient of linear expansion during the resin multilayer substrate being heated, and as a result, the bonding portion may be damaged.

In the present preferred embodiment, a coefficient of linear expansion (CT2) of the adhesive layers 21a to 23a is smaller than a coefficient of linear expansion (CT1) of the resin layers 11a to 13a (CT2<CT1). Further, in the present preferred embodiment, at least a portion of each of the relatively brittle bonding portions 61, 62, 71, and 72 is in contact with the adhesive layers 21a to 23a having a relatively small coefficient of linear expansion. Accordingly, the stress applied to the bonding portions 61, 62, 71, and 72 when the resin multilayer substrate is heated is able to be reduced or prevented, as compared with the case where the bonding portions 61, 62, 71, and 72 are in contact with only the resin layers 11a to 13a. Accordingly, even if the multilayer body includes a plurality of layers including different kinds of materials (resins), breakage of the bonding portions 61, 62, 71, and 72 when the resin multilayer substrate is heated is able to be reduced or prevented.

The expression that the bonding portion is more "brittle" than the via conductor refers to, for example, a case where indentation hardness of the bonding portion is lower than indentation hardness of the via conductor. The indentation hardness is, for example, Vickers hardness (HV).

To reduce or prevent the breakage of the bonding portions during the heating of the resin multilayer substrate, more preferably, the bonding portions are in contact with only the layers (adhesive layers 21a, 22a, and 23a) having a relatively small coefficient of linear expansion, for example.

When an external force (impact, bending stress, or the like), heat, or the like is applied to the resin multilayer substrate, stress tends to concentrate on a bonding section between the via conductor and the planar conductor (a boundary between the via conductor and the planar conductor, a boundary between the bonding portion bonded to the via conductor and the planar conductor, or the like). Accordingly, the resin layer and the adhesive layer have a void are preferably provided near the bonding section between the via conductor and the planar conductor, and a contact portion that contacts the via conductor or the bonding portion, for example.

In the case where the entire or substantially the entire side surface of the via conductor or the like (including the bonding portion) is in contact with the resin layer or the adhesive layer, when an external force, heat, or the like is applied to the resin multilayer substrate, stress is directly applied to the via conductor or the like, and thus the via conductor or the like is likely to be damaged. In particular, peeling is likely to occur at the bonding section between the via conductor and the planar conductor.

Meanwhile, in the case where voids are provided in the entire or substantially the entire side surface of the via conductor (or the bonding portion) among in the resin layer, the adhesive layer, and the like, when an external force, heat, or the like is applied to the resin multilayer substrate, the stress applied to the via conductor (or the bonding portion) is alleviated, but the stress is concentrated on the bonding section and there arises a risk that breakage occurs at the bonding section. In particular, in the present preferred embodiment, since an angle provided by the via conductor and the planar conductor is an acute angle in terms of the shape and the structure, breakage is likely to occur at the bonding section between the via conductor and the planar conductor.

In contrast, in the resin layer or the adhesive layer, by providing voids adjacent to or in a vicinity of the bonding section on which stress is likely to concentrate when an external force, heat, or the like is applied to the resin multilayer substrate, peeling of the bonding section or breakage of the via conductor or the like (including the bonding portion) are able to be reduced or prevented. In addition, since the resin layer or the adhesive layer includes the contact portion in contact with the via conductor or the like, the stress applied to the bonding section and the side surface of the via conductor or the like is able to be dispersed.

The resin multilayer substrate including voids and contact portions provided in the resin layer or the adhesive layer are able to be easily provided by, for example, processes as described below.

A planar conductor is provided in a first layer (the resin layers 11a, 12a, 13a) (conductor formation process). Subsequently, a second layer (the adhesive layers 21a, 22a, 23a) having a smaller coefficient of linear expansion than that of the first layer is pasted (pasting process). Subsequently, holes are provided in the pasted first and second layers, and the holes are filled with a via conductor or the like (including a bonding portion) (interlayer conductor formation process). Thereafter, the first layer and the second layer are heated and pressure-bonded, and then cooled to define a multilayer body (multilayer body formation process).

Since a coefficient of linear expansion of the first layer (the resin layers 11a, 12a, 13a) is larger than that of the second layer (the adhesive layers 21a, 22a, 23a), when the multilayer body, after it is provided by heating, is cooled, voids are provided between the first layer and the via conductor or the like due to a difference in coefficient of linear expansion between the first layer and the second layer. The order of the "conductor formation process" and the "pasting process" may be reversed.

Second Preferred Embodiment

In a second preferred embodiment of the present invention, an example in which the thickness of the resin layer is significantly thicker than that of the adhesive layer will be described.

Figure 10:
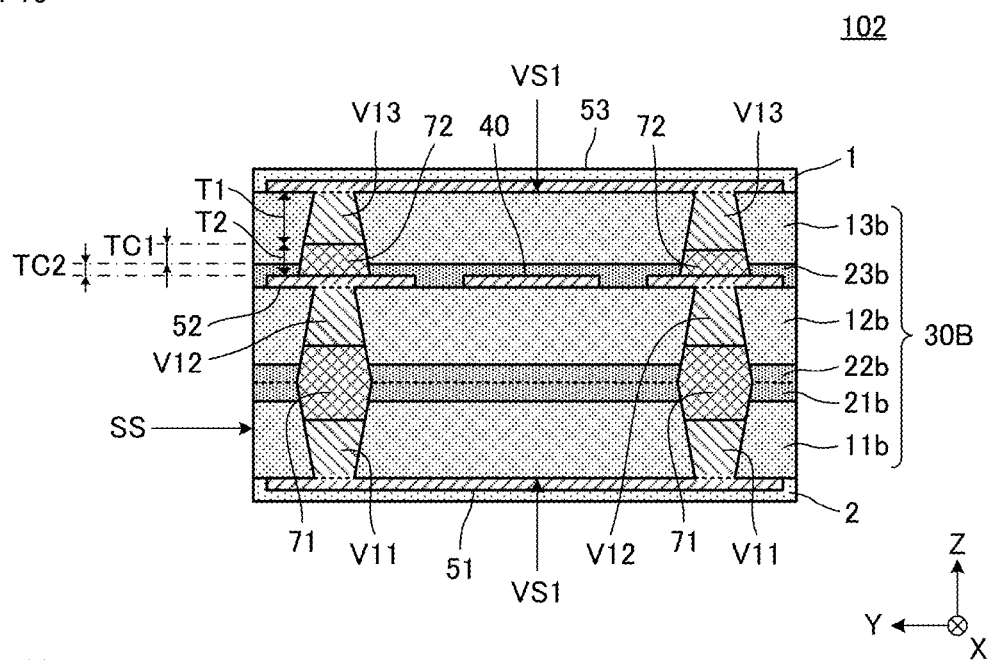
FIG. 10 is a sectional view of a resin multilayer substrate 102 according to a second preferred embodiment of the present invention.

FIG. 10 is a sectional view of a resin multilayer substrate 102 according to the second preferred embodiment.

The resin multilayer substrate 102 is different from the resin multilayer substrate 101 according to the first exemplary preferred embodiment in that a multilayer body 30B is provided therein. Other elements of the resin multilayer substrate 102 are the same or substantially the same as those of the resin multilayer substrate 101.

Hereinafter, portions different from the resin multilayer substrate 101 according to the first preferred embodiment will be described.

The multilayer body 30B is provided by laminating resin layers 11b, 12b and 13b, and adhesive layers 21b, 22b, and 23b. Specifically, the multilayer body 30B is provided by laminating the resin layer 11b, the adhesive layers 21b and 22b, the resin layer 12b, the adhesive layer 23b, and the resin layer 13b in that order.

The resin materials defining the resin layers 11b, 12b, and 13b are the same as or similar to the resin materials of the resin layers 11a, 12a, and 13a described in the first preferred embodiment. The resin materials defining the adhesive layers 21b, 22b, and 23b are the same as or similar to the resin materials of the adhesive layers 21a, 22a, and 23a described in the first preferred embodiment. In the present preferred embodiment, the resin layers 11b, 12b, and 13b correspond to the "gas high-permeable layers", and the adhesive layers 21b, 22b, and 23b correspond to the "gas low-permeable layers".

In the present preferred embodiment, a thickness (D1) of the resin layers 11b, 12b, and 13b (gas high-permeable layers) is thicker than a thickness (D2) of the adhesive layers 21b, 22b, and 23b (gas low-permeable layers) (D1>D2), as illustrated in FIG. 10. In the present preferred embodiment, a thickness (TC1) of a portion of the bonding portion 72 in contact with the resin layer 13b (gas high-permeable layer) is thicker than a thickness (TC2) of a portion of the bonding portion 72 in contact with the adhesive layer (gas low-permeable layer) (TC1>TC2).

With the resin multilayer substrate 102 according to the present preferred embodiment, the following advantageous effects are provided in addition to the advantageous effects described in the first preferred embodiment.

In the present preferred embodiment, the thickness (D1) of the resin layers 11b, 12b, and 13b (gas high-permeable layers) is thicker than the thickness (D2) of the adhesive layers 21b, 22b, and 23b (gas low-permeable layers) (D1>D2). Accordingly, compared to a case where the gas low-permeable layer is thicker than the gas high-permeable layer, a gas generated in the multilayer body when heated or a gas remaining in the multilayer body may be efficiently discharged to the outside.

In the present preferred embodiment, the thickness (TC1) of a portion of the bonding portion 72 in contact with the resin layer 13b (gas high-permeable layer) is thicker than the thickness (TC2) of a portion of the bonding portion 72 in contact with the adhesive layer 23b (gas low-permeable layer) (TC1>TC2). Accordingly, in the bonding portion 72 in which a large amount of gas is generated when heated, an area in contact with the gas high-permeable layer is larger than an area in contact with the gas low-permeable layer. Accordingly, even when the bonding portion 72 is in contact with both the gas high-permeable layer and the gas low-permeable layer, the gas generated in the multilayer body when heated or the gas remaining in the multilayer body may be efficiently discharged to the outside.

Third Preferred Embodiment

In a third preferred embodiment of the present invention, an example in which the bonding portion is in contact with only the gas high-permeable layer will be described.

Figure 11:
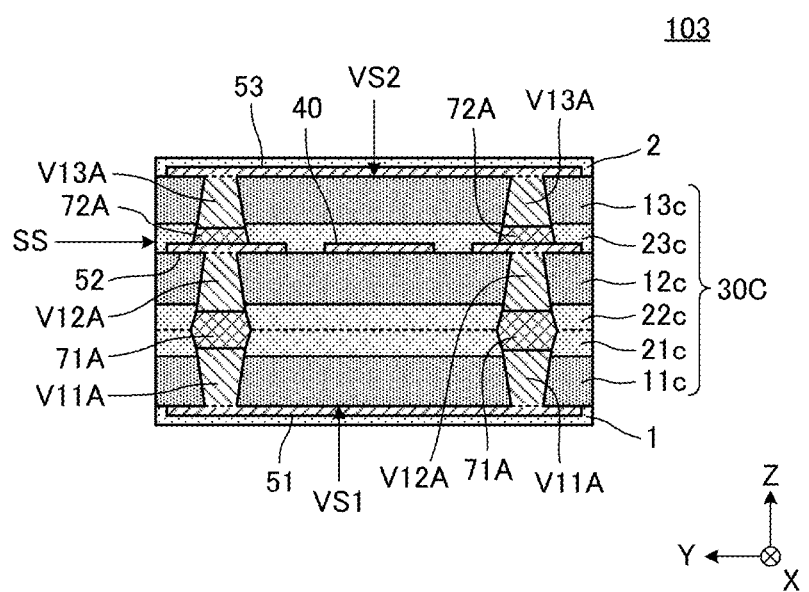
FIG. 11 is a sectional view of a resin multilayer substrate 103 according to a third preferred embodiment of the present invention.

FIG. 11 is a sectional view of a resin multilayer substrate 103 according to the third preferred embodiment.

The resin multilayer substrate 103 is different from the resin multilayer substrate 102 according to the second preferred embodiment in that a multilayer body 30C, via conductors V11A, V12A and V13A, and bonding portions 71A and 72A are provided therein. Other elements of the resin multilayer substrate 103 are substantially the same or substantially the same as the elements of the resin multilayer substrate 102.

Hereinafter, portions different from the resin multilayer substrate 102 according to the second preferred embodiment will be described.

The multilayer body 30C is provided by laminating resin layers 11c, 12c and 13c, and adhesive layers 21c, 22c, and 23c. Specifically, the multilayer body 30C is provided by laminating the resin layer 11c, the adhesive layers 21c and 22c, the resin layer 12c, the adhesive layer 23c, and the resin layer 13c in that order.

The resin layers 11c, 12c, and 13c are resin sheets preferably including, as a main component, a liquid crystal polymer (LCP) or polyetheretherketone (PEEK), for example. The adhesive layers 21c, 22c, and 23c are resin sheets preferably including, as a main component, fluororesin, for example, perfluoroalkoxy alkane (PFA), polytetrafluoroethylene (PTFE), or the like. In the present preferred embodiment, the adhesive layers 21c, 22c, and 23c correspond to the "gas high-permeable layers", and the resin layers 11c, 12c, and 13c correspond to the "gas low-permeable layers".

The thickness of the via conductors V11A, V12A, and V13A is thicker than the thickness of the via conductors V11, V12, and V13 described in the first and second preferred embodiments. On the other hand, the thickness of the bonding portions 71A and 72A is thinner than the thickness of the bonding portions 71 and 72 described in the first and second preferred embodiments.

With the resin multilayer substrate 103 according to the present preferred embodiment, the following advantageous effects are provided in addition to the advantageous effects described in the second preferred embodiment.

In the present preferred embodiment, since the bonding portions 71A and 72A, in each of which a large amount of gas is generated when heated, are provided in the gas high-permeable layers (adhesive layers), the gas generated from the bonding portion when heated is able to be easily discharged to the outside.

Further, in the present preferred embodiment, the bonding portions 71A and 72A are not in contact with the gas low-permeable layers (resin layers), but are in contact with only the gas high-permeable layers (adhesive layers). Therefore, the gases generated from the bonding portions 71A and 72A, in each of which a large amount of gas is generated when heated, may be more efficiently discharged to the outside.

In the present preferred embodiment, the via conductors V11A and V12A are connected to each other via the bonding portion 71A provided only in the adhesive layers 21c and 22c. Positional misalignment is likely to occur at a bonding surface (interface) between different kinds of materials, for example, the resin layers 11c, 12c, 13c and the adhesive layers 21c, 22c, 23c, at the lamination time due to differences in physical properties (for example, a difference in coefficient of linear expansion), and thus connection failure is likely to occur due to the above-described positional misalignment, when the via conductors respectively provided in the layers of the different kinds of materials are connected to each other. To deal with this, for example, when a via conductor provided in the resin layer and a via conductor provided in the adhesive layer are connected to each other, there is a case in which the via conductors are connected while providing therebetween a conductor pattern for connection (for example, the ground conductor 52) having a large area in consideration of the positional misalignment. On the other hand, since positional misalignment is unlikely to occur at the bonding surface between the same or substantially the same materials, for example, the adhesive layers 21c and 22c, it is unnecessary to connect the via conductors via a conductor pattern for connection, for example, in the bonding section of the via conductors V11A and V12A via the bonding portion 71A.

Fourth Preferred Embodiment

Figure 12A:
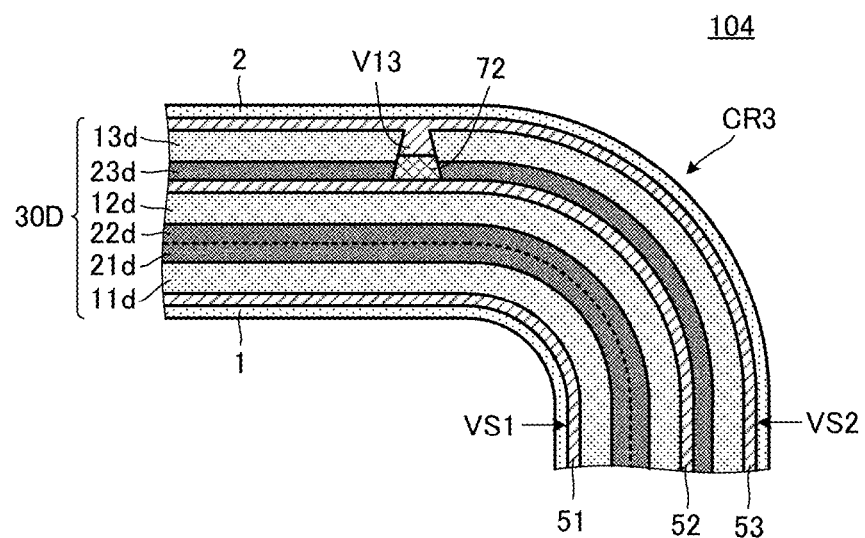
FIGS. 12A and 12B are partially enlarged sectional views of resin multilayer substrates 104 and 104D, respectively, according to a fourth preferred embodiment of the present invention.
Figure 12B:
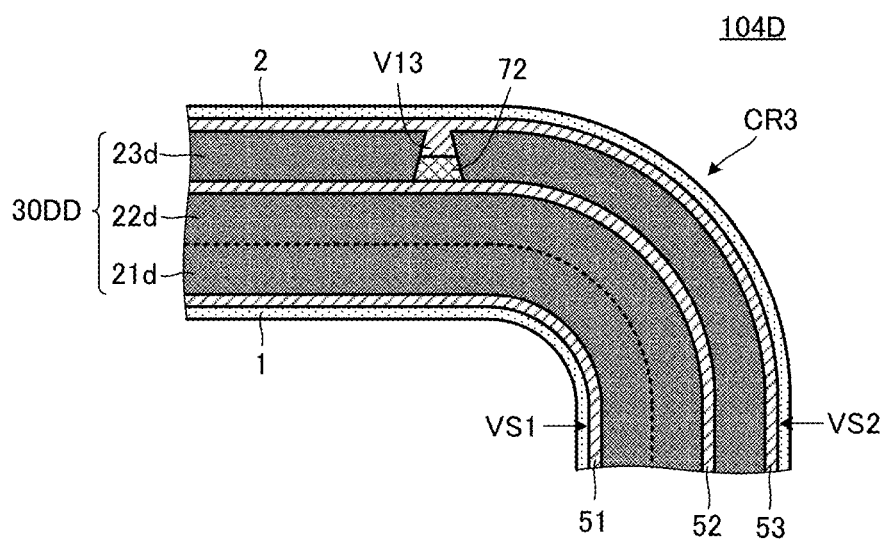

When a resin multilayer substrate 104 according to a fourth preferred embodiment of the present invention includes a bent portion as illustrated in FIG. 8 with respect to the resin multilayer substrate 101 according to the first preferred embodiment, the resin multilayer substrate 104 has structures, as illustrated in FIGS. 12A and 12B respectively, adjacent to or in a vicinity of the bent portion. Hereinafter, the features of the resin multilayer substrate 104 will be described, and description of the same or similar portions as the resin multilayer substrate 101 will be omitted.

FIGS. 12A and 12B are partially enlarged sectional views of the resin multilayer substrates 104 and a resin multilayer substrate 104D, respectively, according to the fourth preferred embodiment. FIGS. 12A and 12B are each an enlarged view of a predetermined range including a bent portion CR3.

As illustrated in FIG. 12A, the resin multilayer substrate 104 (multilayer body 30D) is provided with resin layers 11d, 12d and 13d and adhesive layers 21d, 22d and 23d, and includes the bent portion CR3. Adjacent to or in a vicinity of the bent portion CR3, a via conductor V13 and a bonding portion 72 to connect a ground conductor 53 and a ground conductor 52 are provided. At this time, the via conductor V13 is located at a position closer to a second principal surface VS2 relative to the bonding portion 72. In other words, the via conductor V13 is provided on the surface layer side of the resin multilayer substrate 104 relative to the bonding portion 72.

When the bent portion CR3 is provided, bending stress becomes larger toward the surface layer. However, in the resin multilayer substrate 104, the via conductor V13 including the same or similar material as that of the ground conductor 53 is located at a position close to the surface layer. With this, the bonding strength at the interface between the ground conductor 53 and the via conductor V13 is enhanced in comparison with a case where the bonding portion 72 is directly bonded to the ground conductor 53.

Thus, breakage, cracking, or the like at the interface between the ground conductor 53 and the via conductor V13 due to the bending stress is reduced or prevented. Accordingly, the highly reliable resin multilayer substrate 104 while having the bent portion CR3 is able to be provided.

The above-described structure in which a plurality of ground conductors (for example, the ground conductor 53 and the ground conductor 52) located at different positions in the thickness direction of the resin multilayer substrate is connected may also be applied to a case of a multilayer body 30DD having a structure in which a plurality of layers including the adhesive layers 21d, 22d, and 23d is laminated, as illustrated in FIG. 12B.

Figure 13:
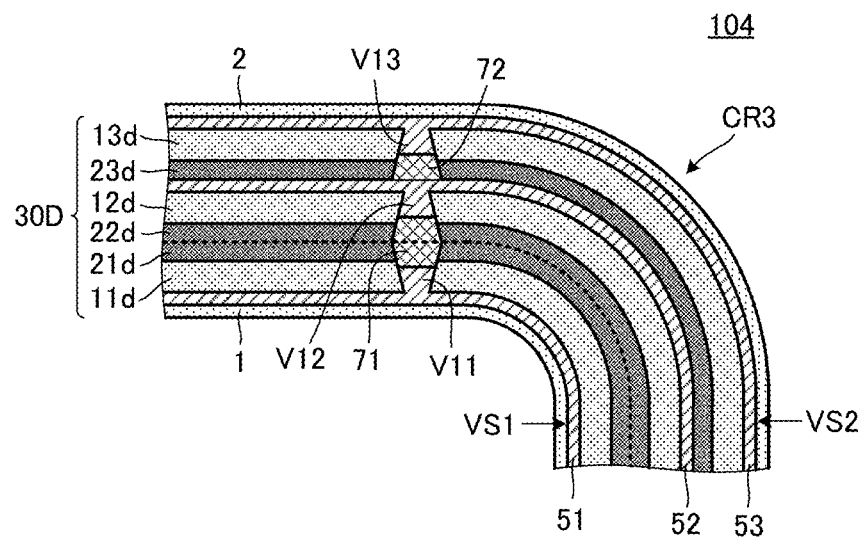
FIG. 13 is another partially enlarged sectional view of the resin multilayer substrate 104 according to the fourth preferred embodiment of the present invention.

The structure in which the plurality of ground conductors located at different positions in the thickness direction of the resin multilayer substrate is connected may also be applied to both a first principal surface VS1 side and the second principal surface VS2 side, as illustrated in FIG. 13. FIG. 13 is another partially enlarged sectional view of the resin multilayer substrate 104 according to the fourth preferred embodiment.

As illustrated in FIG. 13, near the bent portion CR3 of the resin multilayer substrate 104, a via conductor V11, a bonding portion 71, and a via conductor V12 are provided to connect a ground conductor 51 and the ground conductor 52. At this time, the via conductor V11 is located at a position closer to the first principal surface VS1 relative to the bonding portion 71. In other words, the via conductor V11 is provided on a surface layer side of the resin multilayer substrate 104 relative to the bonding portion 71.

As described above, by locating the via conductors V11 and V13 at the positions closest to outer surfaces on both sides in the thickness direction, the occurrence of breakage, cracking, or the like, against the bending stress applied to an outer side portion of the bent portion CR3, and against the bending stress applied to an inner side portion thereof, is able to be reduced or prevented.

The above-described features and elements may be applied to a case where an interlayer connection conductor (a set of a via conductor and a bonding portion) is provided only on the inner side near the bent portion CR3 of the resin multilayer substrate 104.

In the above description, an interlayer connection conductor (a set of a via conductor and a bonding portion) connected to a ground conductor is explained as an example, but the above-discussed features and elements are not limited to the ground conductor, and may be applied to other conductors.

The above-discussed features and elements may be applied to only an interlayer connection conductor (a set of a via conductor and a bonding portion) closest to the bent portion CR3, but may also be applied to other interlayer connection conductors. That is, by applying the above-discussed features and elements to at least the interlayer connection conductor (the set of the via conductor and the bonding portion) closest to the bent portion CR3, the features and advantages described above may be provided.

Fifth Preferred Embodiment

Figure 14:
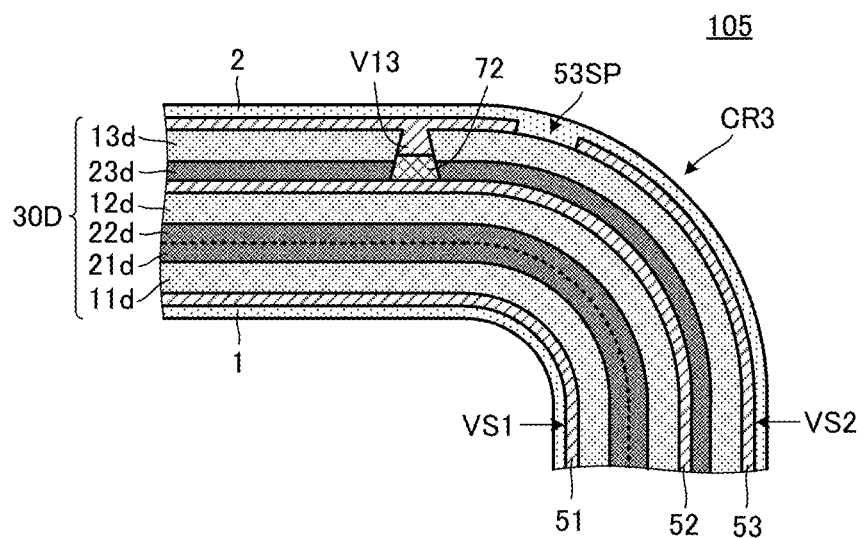
FIG. 14 is a partially enlarged sectional view of a resin multilayer substrate 105 according to a fifth preferred embodiment of the present invention.

FIG. 14 is a partially enlarged sectional view of a resin multilayer substrate 105 according to a fifth preferred embodiment of the present invention. FIG. 14 is an enlarged view of a predetermined range including a bent portion CR3.

As illustrated in FIG. 14, the resin multilayer substrate 105 according to the fifth preferred embodiment is different from the resin multilayer substrate 104 according to the fourth preferred embodiment in that a conductor non-forming portion 53SP is provided therein. Other elements of the resin multilayer substrate 105 are similar to those of the resin multilayer substrate 104, and description of similar portions will be omitted.

The resin multilayer substrate 105 includes the conductor non-forming portion 53SP at a position corresponding to the bent portion CR3 in a ground conductor 53. Adjacent to or in a vicinity of the conductor non-forming portion 53SP, an interlayer connection conductor including a via conductor V13 and a bonding portion 72 is provided.

In this way, deformation is more likely to occur in an area where the conductor non-forming portion 53SP is present in the bent portion CR3. Due to the deformation, a larger bending stress is likely to be generated. However, as described above, since the via conductor V13 is provided on the outer surface side relative to the bonding portion 72, the occurrence of breakage, cracking, and the like due to the bending stress is reduced or prevented.

Sixth Preferred Embodiment

Figure 15:
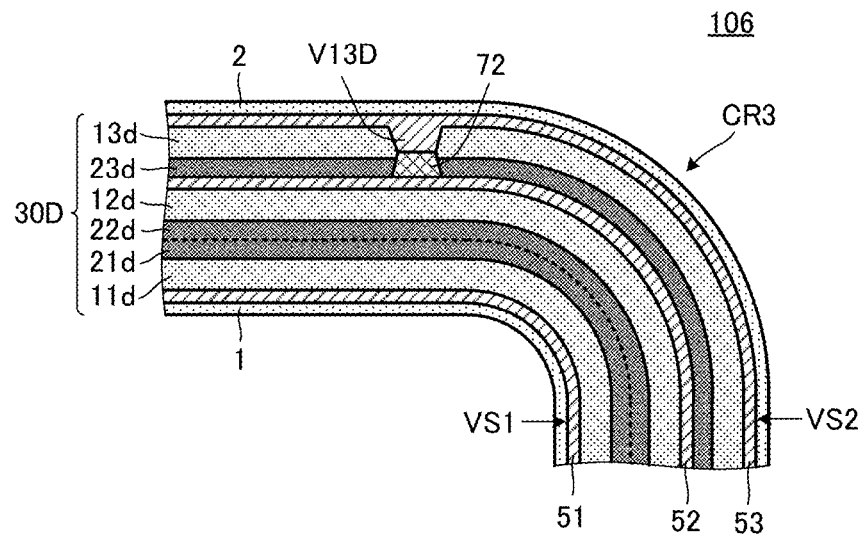
FIG. 15 is a partially enlarged sectional view of a resin multilayer substrate 106 according to a sixth preferred embodiment of the present invention.

FIG. 15 is a partially enlarged sectional view of a resin multilayer substrate 106 according to a sixth preferred embodiment of the present invention. FIG. 15 is an enlarged view of a predetermined range including a bent portion CR3.

As illustrated in FIG. 15, the resin multilayer substrate 106 according to the sixth preferred embodiment is different from the resin multilayer substrate 104 according to the fourth preferred embodiment in that the shape of a via conductor V13D differs. Other elements of the resin multilayer substrate 106 are similar to those of the resin multilayer substrate 104, and description of similar portions will be omitted.

In the via conductor V13D, an area of an interface with a ground conductor 53 is larger than an area of a bonding surface with respect to a bonding portion 72. Accordingly, the bonding strength between the via conductor V13D and the ground conductor 53 is further enhanced. Thus, the occurrence of breakage, cracking, and the like at the interface between the via conductor V13D and the ground conductor 53 is further reduced or prevented.

Other Embodiments

In the preferred embodiments described above, examples in which the resin multilayer substrate is an electronic component surface-mounted on a circuit board have been described, but the resin multilayer substrate is not limited thereto. The resin multilayer substrate may be a cable to connect two circuit boards, or a cable to connect a circuit board and another component. A connector may be provided at a connection portion of the resin multilayer substrate.

In the preferred embodiments described above, examples of the resin multilayer substrate in which the first connection portion CN1, the line portion SL, and the second connection portion CN2 are provided in that order in the transmission direction (X-axis direction) have been described, but the preferred embodiments of the present invention are not limited thereto. The number, the structure, and the locations of the connection portions included in the resin multilayer substrate, and the number the structure, and the locations of the line portions included in the resin multilayer substrate may be changed.

In the preferred embodiments described above, examples in which the multilayer body is a substantially rectangular flat plate having a longitudinal direction in the X-axis direction have been described, but the shape of the multilayer body is not limited thereto. The shape of the multilayer body is able to be changed within a range in which the features and advantages of the preferred embodiments of the present invention are able to be provided. A planar shape of the multilayer body may be, for example, a rectangular or substantially rectangular shape, a polygonal shape, an L shape, a crank shape, a T shape, or a Y shape.

In the preferred embodiments described above, examples of the multilayer body provided by laminating three resin layers and three adhesive layers have been described, but the multilayer body is not limited thereto. The numbers of resin layers and adhesive layers defining the multilayer body are able to be changed. In the resin multilayer substrate, the protective layers 1 and 2 provided on the first principal surface VS1 and the second principal surface VS2, respectively, are not absolutely necessary. The multilayer body may include a layer other than the resin layer and the adhesive layer.

In the preferred embodiments described above, examples in which the multilayer body includes a thermoplastic resin have been described, but the preferred embodiments of the present invention are not limited thereto. The multilayer body may be made of, for example, a thermosetting resin. The multilayer body may be a composite multilayer body of different resin materials, and may be provided by laminating a thermosetting resin sheet, for example, a glass epoxy substrate and a thermoplastic resin sheet, for example. The multilayer body is not limited to a multilayer body in which a the heating press (batch press) is applied to the laminated resin layers and adhesive layer to fusion-bond the surfaces thereof to each other, and the multilayer body may be defined by applying adhesive layers to be provided between the resin layers.

The circuitry provided in or on the resin multilayer substrate is not limited to the above-described preferred embodiments, and is able to be changed within a range in which the features and advantages of the preferred embodiments of the present invention are provided. The circuit provided in or on the resin multilayer substrate may include, for example, coils, inductors, and the like defined by conductor patterns, capacitors defined by conductor patterns, and frequency filters of various kinds of filters (a low pass filter, a high pass filter, a band pass filter, a band elimination filter, and the like). For example, various kinds of other transmission lines (a microstrip line, coplanar line, and the like) may be provided in or on the resin multilayer substrate. Further, various kinds of electronic components, for example, chip components may be mounted on or embedded in the resin multilayer substrate.

In the preferred embodiments described above, examples of the resin multilayer substrate in which a single transmission line is provided have been described, but the preferred embodiments of the present invention are not limited thereto, and the number of transmission lines may be changed in accordance with the circuitry provided in or on the resin multilayer substrate.

In the preferred embodiments described above, examples in which the material of the via conductors is the same as or similar to the material (Cu) of the planar conductors (the mounting electrodes P1 and P2, the signal conductor 40, and the ground conductors 51, 52, and 53) have been described, but the preferred embodiments of the present invention are not limited thereto. The via conductor may be made of a material (for example, Ni—Sn plating) different from the material of the planar conductor, which is Cu.

In the preferred embodiments described above, examples in which the plurality of via conductors V11, V11A, V12, V12A, V13, and V13A are provided in the transmission direction (X-axis direction) have been described, but the preferred embodiments of the present invention are not limited thereto. The number, the structure, the locations, and the like of the via conductors including the via conductors V11, V11A, V12, V12A, V13, and V13A are able to be changed.

In the preferred embodiments described above, examples in which the rectangular or substantially rectangular mounting electrodes P1 and P2 and ground electrodes PG1 and PG2 are provided on the first principal surface VS1 have been described, but the preferred embodiments of the present invention are not limited thereto. The shapes, the numbers, the structure, the locations, and the like of the mounting electrodes and the ground electrodes are able to be changed. The planar shapes of the mounting electrode and the ground electrode may be, for example, a polygonal shape, a circular shape, an elliptical shape, an arc shape, a ring shape, an L shape, a U shape, a T shape, a Y shape, or a crank shape. The mounting electrodes and the ground electrodes may be provided on both the first principal surface VS1 and the second principal surface VS2. The resin multilayer substrate may include a dummy electrode in addition to the mounting electrodes and the ground electrodes.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a multilayer body including a resin layer and an adhesive layer that are laminated;
   via conductors in the resin layer; and
   a bonding portion in the adhesive layer and connected to at least one of the via conductors; wherein
   the bonding portion is conductive;
   a first one of the resin layer and the adhesive layer is a gas high-permeable layer having gas permeability higher than gas permeability of a second one of the resin layer and the adhesive layer, and the second one is a gas low-permeable layer having the gas permeability lower than the gas permeability of the first one of the resin layer and the adhesive layer; and
   the bonding portion includes an organic substance or a portion having a void content rate per unit plane sectional area higher than a void content rate per unit plane sectional area of the via conductor, and at least a portion of the bonding portion contacts the gas high-permeable layer.

2. The resin multilayer substrate according to claim 1, wherein a thickness of the via conductor is thicker than a thickness of the bonding portion.

3. The resin multilayer substrate according to claim 1, wherein a thickness of a portion of the bonding portion in contact with the gas high-permeable layer is thicker than a thickness of a portion of the bonding portion in contact with the gas low-permeable layer.

4. The resin multilayer substrate according to claim 1, wherein the bonding portion is in contact with only the gas high-permeable layer.

5. The resin multilayer substrate according to claim 1, wherein an interface between the via conductor and the bonding portion is located in the gas high-permeable layer.

6. The resin multilayer substrate according to claim 1, wherein a thickness of the gas high-permeable layer is thicker than a thickness of the gas low-permeable layer.

7. The resin multilayer substrate according to claim 1, wherein the resin layer and the adhesive layer are each made of a thermoplastic resin.

8. The resin multilayer substrate according to claim 1, wherein a relative dielectric constant of the gas high-permeable layer is lower than a relative dielectric constant of the gas low-permeable layer.

9. The resin multilayer substrate according to claim 8, wherein
   the gas high-permeable layer is a resin sheet including fluororesin as a main component; and
   the gas low-permeable layer is a resin sheet including a liquid crystal polymer as a main component.

10. The resin multilayer substrate according to claim 1, further comprising:
    a first protective layer having gas permeability lower than gas permeability of the gas high-permeable layer; wherein
    the multilayer body includes a first principal surface orthogonal or substantially orthogonal to a lamination direction of the resin layer and the adhesive layer, and a side surface adjacent to the first principal surface;
    the first protective layer is on the first principal surface; and
    the gas high-permeable layer is exposed to the side surface.

11. The resin multilayer substrate according to claim 10, wherein
    an electrode is provided on the principal surface of the multilayer body; and
    the protective layer includes an opening that corresponds to a position of the electrode on the principal surface of the multilayer body.

12. The resin multilayer substrate according to claim 10, further comprising
    a second protective layer having gas permeability lower than the gas permeability of the gas high-permeable layer; wherein
    the multilayer body includes a second principal surface orthogonal or substantially orthogonal to a lamination direction of the resin layer and the adhesive layer;
    the second protective layer is provided on the second principal surface; and
    the first principal surface and the second principal surface are different surfaces.

13. The resin multilayer substrate according to claim 1, wherein
    the multilayer body has a shape extending in one direction orthogonal or substantially orthogonal to a thickness direction, and includes a bent portion in the extending direction; and
    of a set of the via conductor and the bonding portion that is present at a position closest to the bent portion and also closest to the principal surface being orthogonal or substantially orthogonal to the thickness direction and defining an outer surface of the multilayer body, the via conductor is provided on the principal surface side relative to the bonding portion.

14. The resin multilayer substrate according to claim 13, wherein
    sets of the via conductor and the bonding portion are located with respect to a first principal surface and a second principal surface provided at both ends in the thickness direction of the multilayer body, respectively;
    of the set of the via conductor and the bonding portion adjacent to or in a vicinity of the first principal surface, the via conductor is provided on the first principal surface side relative to the bonding portion; and
    of the set of the via conductor and the bonding portion adjacent to or in a vicinity of the second principal surface, the via conductor is provided on the second principal surface side relative to the bonding portion.

15. The resin multilayer substrate according to claim 13, wherein a positional relationship between the via conductor and the bonding portion is provided for a set of the via conductor and the bonding portion adjacent to or in a vicinity of the principal surface on a side where an area of a planar conductor in the multilayer body is smaller.

16. The resin multilayer substrate according to claim 1, wherein the bonding portion is directly connected to two of the via conductors.

17. The resin multilayer substrate according to claim 1, wherein the bonding portion is solidified by heat during a heating press.

18. The resin multilayer substrate according to claim 1, wherein
the resin multilayer substrate includes a first connection portion, a second connection portion, and a line portion;
the first connection portion includes a first mounting electrode and a first ground electrode;
the second connection portion includes a second mounting electrode and a second ground electrode; and
the line portion connects the first connection portion and the second connection portion.

19. The resin multilayer substrate according to claim 1, wherein the bonding portion connects at least two of the via conductors.

20. An electronic apparatus comprising:
a resin multilayer substrate; and
another structure; wherein
the resin multilayer substrate includes:
    a multilayer body including a resin layer and an adhesive layer that are laminated;
    via conductors in the resin layer; and
    a bonding portion in the adhesive layer and connected to at least one of the via conductors,
the bonding portion is conductive;
a first one of the resin layer and the adhesive layer is a gas high-permeable layer having gas permeability higher than gas permeability of a second one of the resin layer and the adhesive layer, and the second one of the resin layer and the adhesive layer is a gas low-permeable layer having the gas permeability lower than the gas permeability of the first one of the resin layer and the adhesive layer;
the bonding portion is a portion including an organic substance or a portion having a void content rate per unit plane sectional area higher than a void content rate per unit plane sectional area of the via conductor, and at least a portion of the bonding portion contacts the gas high-permeable layer; and
the resin multilayer substrate is connected to the another structure via a conductive bonding structure.

* * * * *